United States Patent
Dosho et al.

(10) Patent No.: US 8,847,812 B2
(45) Date of Patent: Sep. 30, 2014

(54) TIME-TO-DIGITAL CONVERSION STAGE AND TIME-TO-DIGITAL CONVERTER INCLUDING THE SAME

(75) Inventors: Shiro Dosho, Osaka (JP); Takuji Miki, Kyoto (JP)

(73) Assignee: Panasonic Corporation, Osaka (JP)

( * ) Notice: Subject to any disclaimer, the term of this patent is extended or adjusted under 35 U.S.C. 154(b) by 271 days.

(21) Appl. No.: 13/589,550

(22) Filed: Aug. 20, 2012

(65) Prior Publication Data

US 2012/0313803 A1 Dec. 13, 2012

Related U.S. Application Data

(63) Continuation of application No. PCT/JP2010/005212, filed on Aug. 24, 2010.

(30) Foreign Application Priority Data

Feb. 24, 2010 (JP) ................................. 2010-038781

(51) Int. Cl.
*H03M 1/50* (2006.01)
*G04F 10/00* (2006.01)
*H03K 5/151* (2006.01)

(52) U.S. Cl.
CPC ............ *G04F 10/005* (2013.01); *H03K 5/1515* (2013.01); *H03M 1/50* (2013.01)
USPC ........... 341/166; 341/155; 341/160; 341/165; 330/69; 330/252

(58) Field of Classification Search
CPC ...... H03M 1/50; H03K 5/1515; G04F 10/005
USPC .............................. 341/130–166; 330/69, 252
See application file for complete search history.

(56) References Cited

U.S. PATENT DOCUMENTS

| | | | |
|---|---|---|---|
| 7,916,064 B2 * | 3/2011 | Lin et al. ...................... | 341/166 |
| 8,228,219 B2 * | 7/2012 | Henzler et al. ............... | 341/120 |
| 8,669,810 B2 * | 3/2014 | Kwon et al. ................... | 330/69 |
| 2009/0225631 A1 | 9/2009 | Shimizu et al. | |

(Continued)

OTHER PUBLICATIONS

International Search Report issued in International Patent Application No. PCT/JP2010/005212 dated Oct. 12, 2010.

(Continued)

*Primary Examiner* — Lam T Mai
(74) *Attorney, Agent, or Firm* — McDermott Will & Emery LLP

(57) ABSTRACT

In a time-to-digital conversion stage, a time-to-digital conversion circuit outputs an n-bit digital signal, which represents an integer value ranging from $-(2^{n-1}-1)$ to $+(2^{n-1}-1)$, based on a phase difference between a first and a second signals input thereto; a time difference amplifier circuit amplifies the phase difference between the first and the second signals $2^{n-1}$ times, and outputs two signals having an amplified phase difference therebetween; a delay adjustment circuit adds a phase difference dependent on the digital signal to the two signals output from the time difference amplifier circuit, and outputs another two signals; an output detection circuit detects that the delay adjustment circuit has output the another two signals, and outputs a detection signal; and a storage circuit latches the digital signal in synchronism with the detection signal. Multi-stage coupling of the time-to-digital conversion stages forms a pipeline time-to-digital converter.

29 Claims, 22 Drawing Sheets

(56) References Cited

U.S. PATENT DOCUMENTS

2012/0313803 A1* 12/2012 Dosho et al. .................. 341/166
2013/0249627 A1* 9/2013 Kwon et al. .................... 330/69
2013/0335251 A1* 12/2013 Dosho et al. .................. 341/166

OTHER PUBLICATIONS

M. Lee et al., "A 9b, 1.25ps Resolution Course-Fine Time-to-Digital Converter in 90nm CMOS that Amplifies a Time Residue," 2007 Symposium on VLSI Circuits Digest of Technical Papers, pp. 168-169, Jun. 2007.

T. Nakura et al., "Time Difference Amplifier using Closed-Loop Gain Control," 2009 Symposium on VLSI Circuits Digest of Technical Papers, pp. 208-209, 2009.

M. Lee et al., "A 9b, 1.25ps Resolution Course-Fine Time-to-Digital Converter in 90 nm CMOS that Amplifies a Time Residue," IEEE Journal of Solid State Circuits, vol. 43, No. 4, Apr. 2008.

* cited by examiner

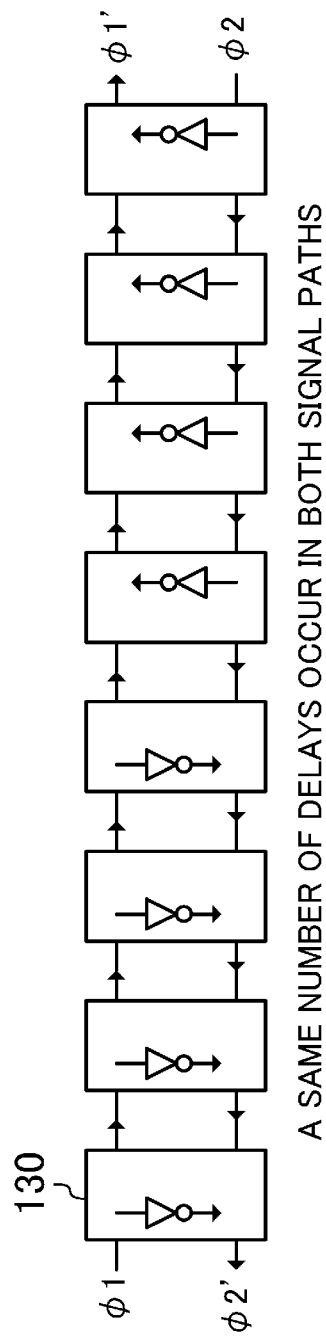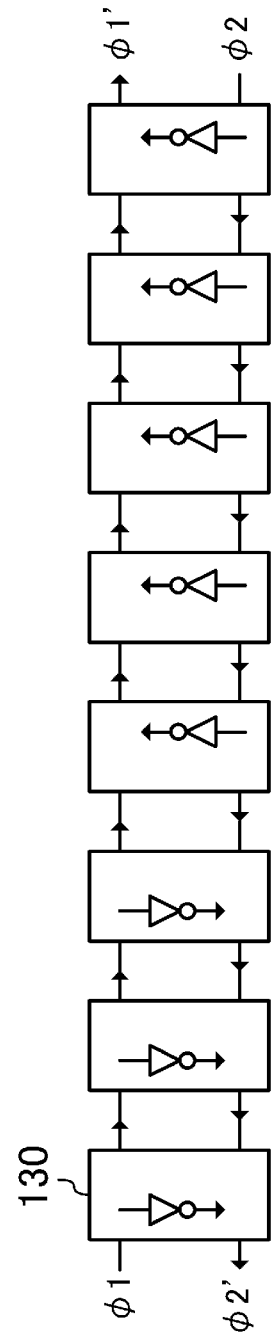

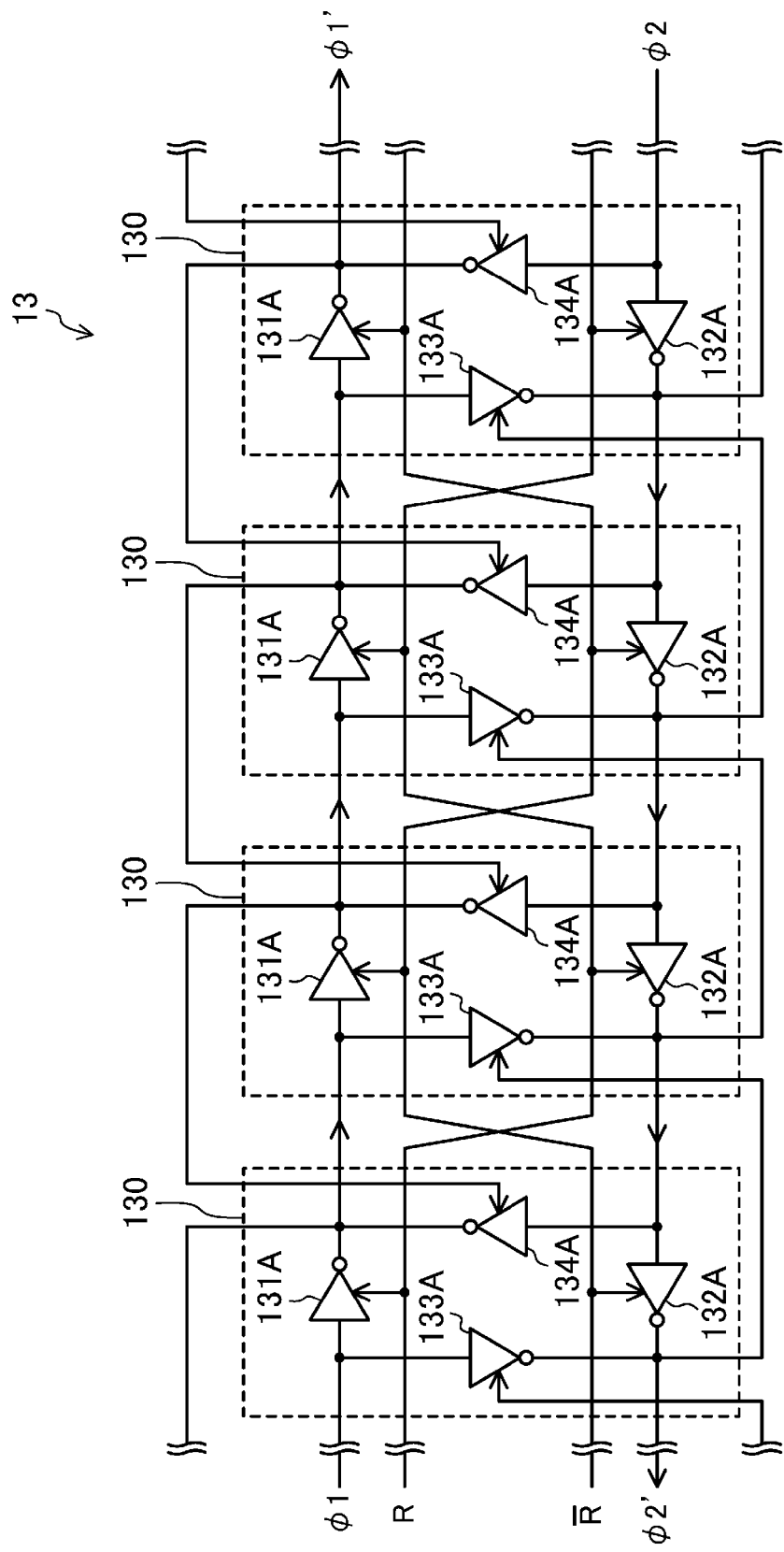

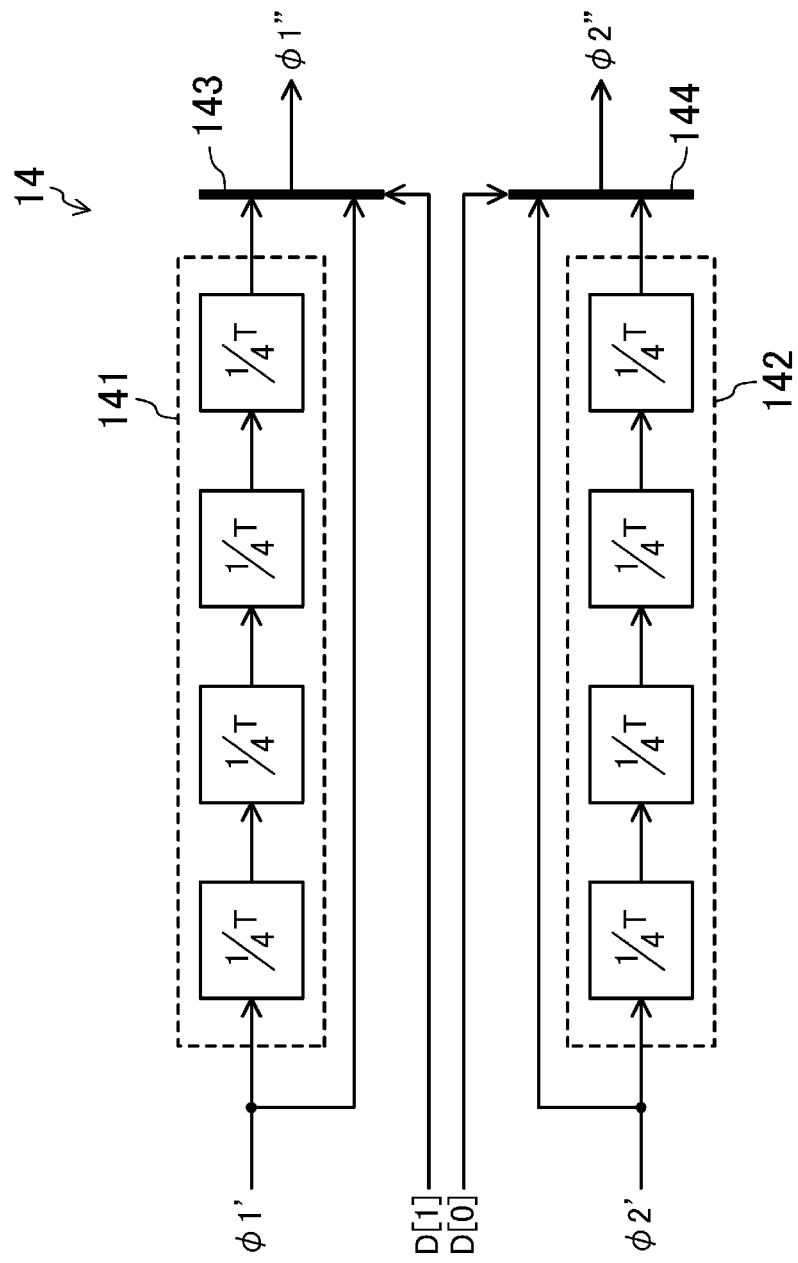

TIME-TO-DIGITAL CONVERSION STAGE AND TIME-TO-DIGITAL CONVERTER INCLUDING THE SAME

CROSS-REFERENCE TO RELATED APPLICATION

This is a continuation of PCT International Application PCT/JP2010/005212 filed on Aug. 24, 2010, which claims priority to Japanese Patent Application No. 2010-038781 filed on Feb. 24, 2010. The disclosures of these applications including the specifications, the drawings, and the claims are hereby incorporated by reference in its entirety.

BACKGROUND

The present disclosure relates to time-to-digital converters which digitize phase differences between signals.

In recent years, as digital phase locked loop circuits develop, time-to-digital converters, which digitize analog temporal information, have been actively developed. A typical time-to-digital converter receives a first signal into an inverter chain having a plurality of inverter circuits coupled in series, latches the output of each inverter circuit in synchronism with a second signal, and detects the point at which the status of the inverter chain changes, thereby digitizes the phase difference between the first and the second signals. However, this configuration cannot achieve resolution equal to or lower than the delay time of each inverter circuit. Thus, the phase difference between the output of each inverter circuit and the second signal is amplified by a time difference amplifier, and the output phase difference is also digitized by another time-to-digital converter, thereby achieving resolution equal to or lower than the delay time of each inverter circuit (see, e.g., Non-Patent Document 1: M. Lee and A. A. Abidi, "A 9b, 1.25 ps Resolution Coarse-Fine Time-to-Digital Converter in 90 nm CMOS that Amplifies a Time Residue," 2007 Symposium on VLSI Circuits Digest of Technical Papers, pp. 168-169, June 2007).

In addition, a time difference amplifier circuit is known which includes two chains each having a plurality of variable delay cells, where the two chains are cross-coupled so that the output of each variable delay cell in one chain controls the gain of each variable delay cell in the other chain (see, e.g., Non-Patent Document 2: T. Nakura, S. Mandai, M. Ikeda, and K. Asada, "Time Difference Amplifier using Closed-Loop Gain Control," 2009 Symposium on VLSI Circuits Digest of Technical Papers, pp. 208-209, June 2009).

Conventional high-resolution time-to-digital converters require a time difference amplifier and a time-to-digital converter both at the output of each inverter circuit, thereby causing the total circuit size and the power consumption to be increased.

Accordingly, there is a need for a small-sized high-resolution time-to-digital converter.

SUMMARY

In one general aspect, the present disclosure describes a time-to-digital conversion stage that includes a time-to-digital conversion circuit configured to output a digital signal having an n-bit width, which represents an integer value ranging from $-(2^{n-1}-1)$ to $+(2^{n-1}-1)$, based on a phase difference between a first and a second signals input thereto, a time difference amplifier circuit configured to receive the first and the second signals, to amplify the phase difference between the first and the second signals received $2^{n-1}$ times, and to output two resultant signals having an amplified phase difference therebetween, a delay adjustment circuit configured to receive the two resultant signals output from the time difference amplifier circuit, to add a phase difference dependent on the digital signal to the two resultant signals, and to output another two resultant signals, an output detection circuit configured to detect that the delay adjustment circuit has output the another two resultant signals, and to output a detection signal, and a storage circuit configured to latch the digital signal in synchronism with the detection signal.

In another general aspect, the present disclosure describes a time-to-digital conversion stage that includes a time-to-digital conversion circuit configured to output a digital signal having a one-bit width based on whether a first signal input thereto leads or lags a second signal input thereto in phase, a time difference amplifier circuit configured to receive the first and the second signals, to amplify a phase difference between the first and the second signals received m times (where m is equal to or less than two), and to output two resultant signals having an amplified phase difference therebetween, a delay adjustment circuit configured to receive the two resultant signals output from the time difference amplifier circuit, and to add a phase difference dependent on the digital signal to the two resultant signals received, and to output another two resultant signals, an output detection circuit configured to detect that the delay adjustment circuit has output the another two resultant signals, and to output a detection signal, and a storage circuit configured to latch the digital signal in synchronism with the detection signal.

Each of these time-to-digital conversion stages converts analog temporal information represented by a phase difference between input signals into a digital value, and outputs two signals which represent analog temporal information which is obtained by subtracting a time difference corresponding to the corresponding digital value from the phase difference between the input signals, as a phase difference. Multi-stage coupling of these time-to-digital conversion stages achieves a small-sized high-resolution pipeline or cyclic time-to-digital converter.

BRIEF DESCRIPTION OF THE DRAWINGS

The figures depict one or more implementations in accordance with the present teaching, by way of example only, not by way of limitations. In the figures, like reference numerals refer to the same or similar elements.

FIGS. 4A and 4B each illustrate a diagram for explaining the principles of operation of the time difference amplifier circuit;

FIG. 6 illustrates an example configuration of the time difference amplifier circuit which has been improved for achieving lower power consumption and shorter initialization time;

FIG. 9 illustrates an example configuration of the delay adjustment circuit in a 1.5-bit stage;

DETAILED DESCRIPTION

Embodiment of Time-to-Digital Conversion Stage

Figure 1:
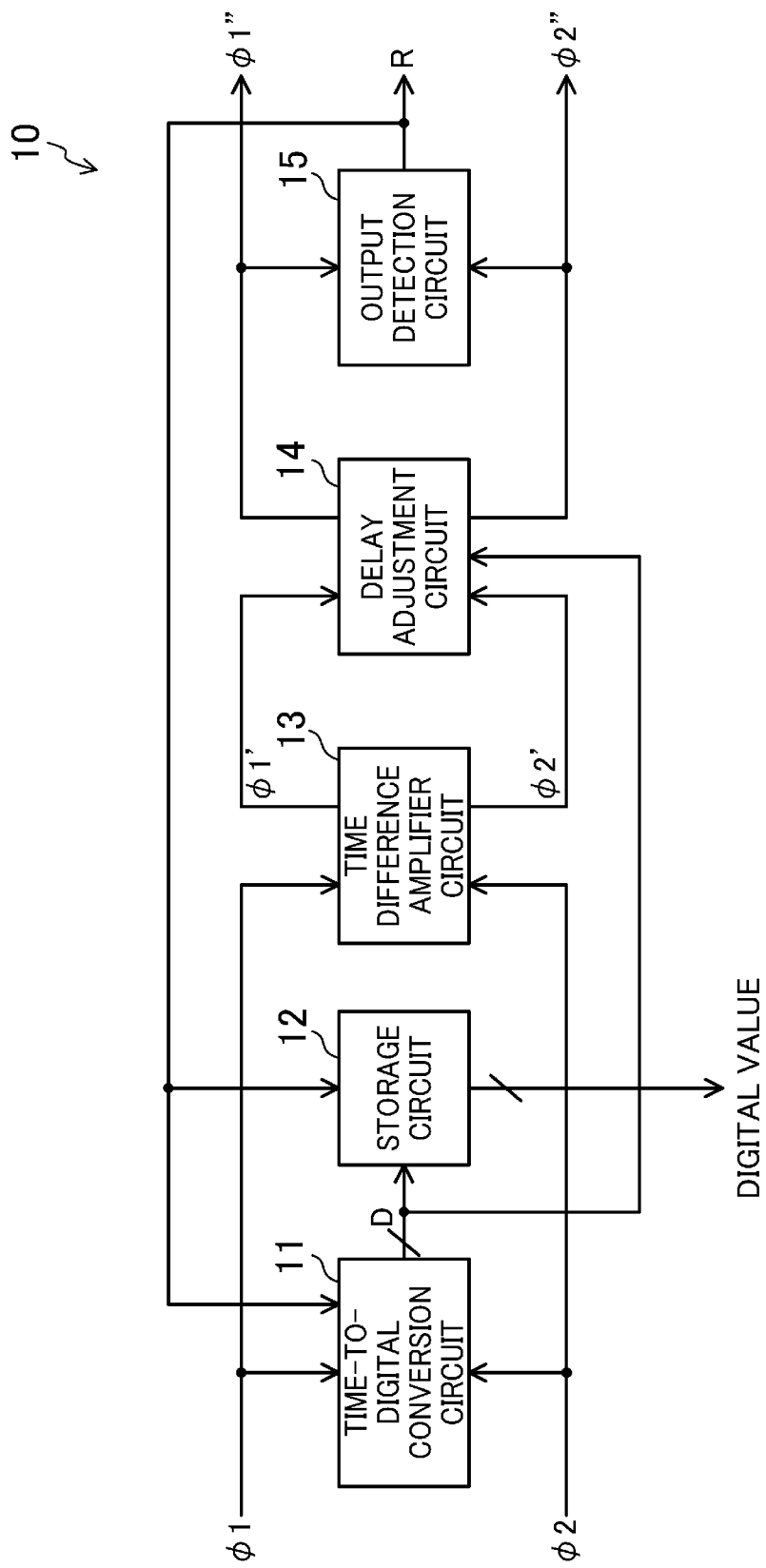
FIG. 1 illustrates a configuration of a time-to-digital conversion stage according to an embodiment of the present teaching.

FIG. 1 illustrates a configuration of a time-to-digital conversion stage according to an embodiment of the present teaching. The time-to-digital conversion stage 10 according to this embodiment is configured to output a digital value based on a phase difference between input signals ø1 and ø2, and is also configured to amplify the phase difference between input signals ø1 and ø2, thereby to generate signals ø1' or and ø2', to adjust the phase difference between the input signals ø1' and ø2' based on the digital signal, and thereby to output signals ø1" and ø2". The time-to-digital conversion stage 10 can be applied to each stage, for example, in a pipeline and a cyclic time-to-digital converters, which will be described later.

Example of 1.5-Bit Stage

Figure 2:
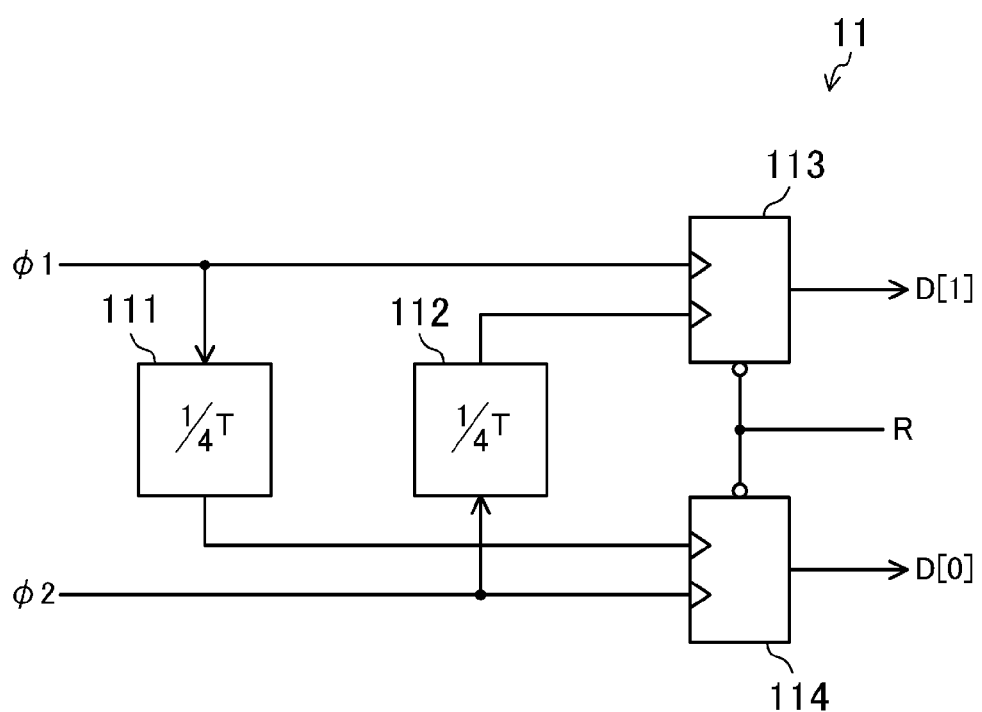
FIG. 2 illustrates an example configuration of the time-to-digital conversion circuit in a 1.5-bit stage.

A case will be described in which the resolution of the time-to-digital conversion stage 10 is 1.5 bits. The time-to-digital conversion circuit 11 is configured to output a two-bit digital signal D which represents one of "−1," "0," and "+1" based on the phase difference between the input signals ø1 and ø2. The storage circuit 12 is configured to latch the digital signal D in synchronism with a detection signal R described later. FIG. 2 illustrates an example configuration of the time-to-digital conversion circuit 11 in a 1.5-bit stage. Delay circuits 111 and 112 are respectively configured to delay the input signals ø1 and ø2 by an amount of time of T/4 (where ±T is the maximum time difference which is convertible by the time-to-digital conversion stage 10), and to output the delayed signals. A phase comparison circuit 113 is configured to detect whether the output signal of the delay circuit 112 leads or lags the signal ø1 in phase, and to output D[1], which is the more significant bit of the signal D. A phase comparison circuit 114 is configured to detect whether the output signal of the delay circuit 111 leads or lags the signal ø2 in phase, and to output D[0], which is the less significant bit of the signal D. The phase comparison circuits 113 and 114 are both configured to be initialized by the signal R. The phase comparison circuits 113 and 114 can both be formed by RS flip-flops having a reset function, etc. Such a configuration allows the time-to-digital conversion circuit 11 to determine within which of the ranges −T<θ<−T/4, −T/4<θ<+T/4, and +T/4<θ<+T the phase difference θ between the signals ø1 and ø2 falls, and to output the determination result as the signal D. For example, when −T<θ<−T/4, the value of D is "01"; when −T/4<θ<+T/4, the value of D is "00"; and when +T/4<θ<+T, the value of D is "10."

Figure 3:
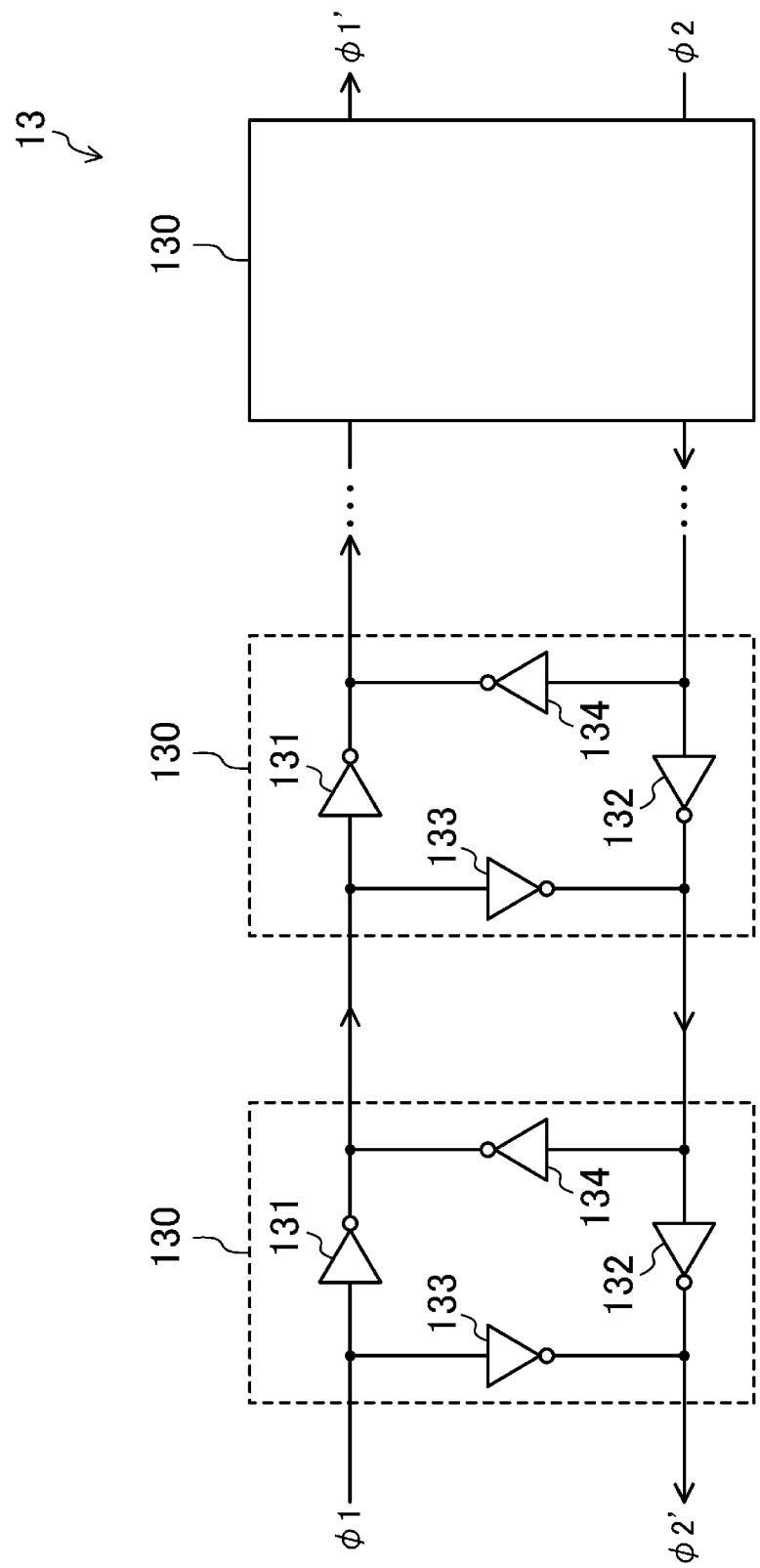
FIG. 3 illustrates an example configuration of the time difference amplifier circuit.

Returning again to FIG. 1, the time difference amplifier circuit 13 is configured to receive the signals ø1 and ø2, to amplify twice the phase difference between the signals ø1 and ø2, and to output signals ø1' and ø2' having the amplified phase difference therebetween. FIG. 3 illustrates an example configuration of the time difference amplifier circuit 13. The time difference amplifier circuit 13 includes an even number of basic circuits 130 coupled in series, each having two inputs and two outputs. Each of the basic circuits 130 includes four inverter circuits 131, 132, 133, and 134. The inputs of the inverter circuits 131 and 133, the inputs of the inverter circuits 132 and 134, the outputs of the inverter circuits 131 and 134, and the outputs of the inverter circuits 132 and 133 are respectively shared. The drive capabilities of the inverter circuits 131 and 132 are the same, and the inputs/outputs of the inverter circuits 131 and 132 are the first and the second inputs/outputs, respectively. The drive capabilities of the inverter circuits 133 and 134 are the same, and are lower than that of the inverter circuits 131 and 132. Thus, inverse logic values of output signals of the inverter circuits 131 and 132 are respectively output from the inverter circuits 133 and 134, thereby causing signal collisions, which delay output transitions of the inverter circuits 131 and 132. For example, if an input signal of the inverter circuit 131 transitions before an input signal of the inverter circuit 132 transitions, then the inverter circuit 134 outputs the inverse logic value after the output signal of the inverter circuit 131 has transitioned. Therefore, the output transition of the inverter circuit 131 is not delayed by the output signal of the inverter circuit 134. On the other hand, the inverter circuit 133 outputs the inverse logic value before the output signal of the inverter circuit 132 transitions, and therefore the output transition of the inverter circuit 132 is delayed by the output signal of the inverter circuit 133.

The principles of operation of the time difference amplifier circuit 13 when eight of the basic circuits 130 of FIG. 3 are coupled in series will be described referring to FIGS. 4A and 4B. If there is no phase difference between the signals of ø1 and ø2, then the signals ø1 and ø2 respectively pass through earlier than the other signals in the first four basic circuits 130, thereby causing no delays in output transitions by the other signals. Conversely, in the last four basic circuits 130, the other signals pass through earlier, thereby causing delays in output transitions (see FIG. 4A). However, output transitions of the signals ø1 and ø2 are delayed in a same number of basic circuits 130, and thus the signals ø1 and ø2 are delayed by a same amount of time, thereby causing the phase difference between the signals ø1 and ø2 to be maintained. Accordingly, no phase difference occurs between the signals ø1' and ø2'.

On the other hand, if the signal ø1 lags the signal ø2, then the signal ø1 has no output transitions delayed, for example, in the first three basic circuits 130, but has output transitions delayed in the last five basic circuits 130. Conversely, the signal ø2 has no output transitions delayed in the first five basic circuits 130, but has output transitions delayed in the last three basic circuits 130 (see FIG. 4B). Thus, the signal ø1 is delayed more than the signal ø2, and the phase difference between the signals ø1' and ø2' is greater than that between the signals ø1 and ø2. In this way, one of the two signals which is input later to the time difference amplifier circuit 13 is delayed more than the other of the two signals which is input earlier, and is then output. Thus, the phase difference between the two signals can be amplified. Note that the gain can be adjusted to a desire value by appropriately changing the number of the basic circuits 130 and the ratio between the drive capabilities of the inverter circuits 131 and 132 and of the inverter circuits 133 and 134.

Figure 5:
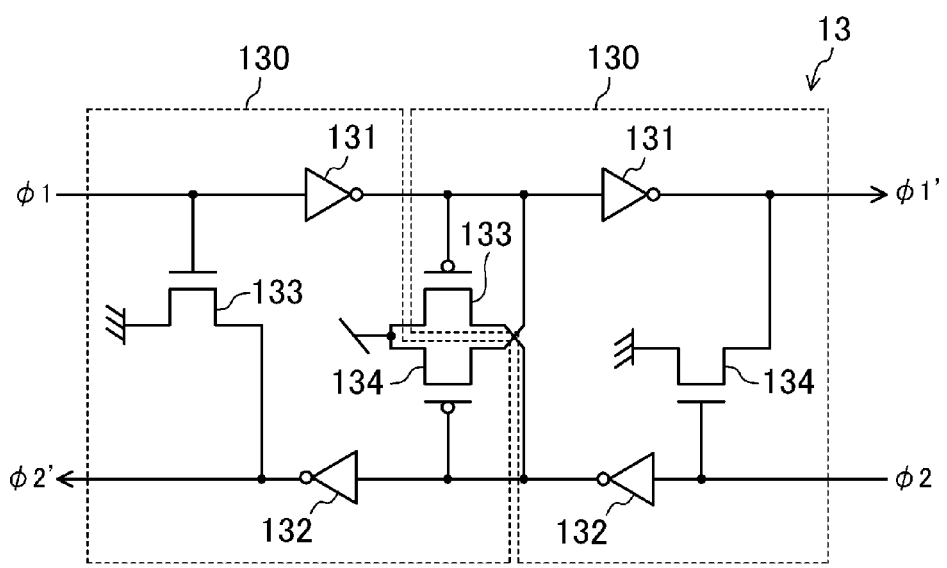
FIG. 5 illustrates an example configuration of the time difference amplifier circuit when inverter circuits are each formed by a single transistor.

If the inverter circuits 133 and 134 are formed by complementary metal oxide semiconductor (CMOS) devices, the inverter circuits 133 and 134 respectively output the inverse logic values of the output signals of the inverter circuits 131 and 132 in a stationary state in which the signals ø1 and ø2 are not input, and therefore leakage currents flow. Thus, as shown in FIG. 5, the inverter circuits 133 and 134 may each be formed by a single transistor having a polarity opposite to each other. For example, if, in a basic circuit 130, the inverter circuit 133 is formed by an NMOS transistor, then the inverter circuit 134 is formed by a PMOS transistor. Moreover, in another basic circuit 130 coupled to that basic circuit 130, the inverter circuits 133 and 134 are respectively formed by a PMOS transistor and an NMOS transistor. Such a configuration prevents leakage currents from flowing in a stationary state. Note that if a phase difference at falling edges of the signals ø1 and ø2 is to be amplified, this is achieved by reversing all the polarities of the inverter circuits 133 and 134 shown in FIG. 5.

With the configuration shown in FIG. 5, once the signals ø1 and ø2 are input, leakage currents flow in the inverter circuits 133 and 134 until the time difference amplifier circuit 13 is initialized. That is, in a stationary state in which the signals ø1 and ø2 are input, the transistors constituting the inverter circuits 133 and 134 are all in an ON state, and the transistors in the inverter circuits 131 and 132, which transistors have polarities opposite to those of the above-mentioned transistors and have drains coupled together, are also in an ON state. Accordingly, shoot-through currents flow from the supply voltage (or from ground) of the inverter circuits 131 and 132 to ground (or to the supply voltage) of the inverter circuits 133 and 134. In addition, the time difference amplifier circuit 13 is initialized by, for example, inputting falling edges of the signals ø1 and ø2. This process prevents next rising edges of the signals ø1 and ø2 from being input to the time difference amplifier circuit 13 until the current falling edges of the signals ø1 and ø2 completely pass through the inverter circuits 131 and 132 of all the basic circuits 130, thereby leading to a long waiting time for the time difference amplifier circuit 13 to be available again. Thus, it is preferable to seek lower power consumption and shorter initialization time for the time difference amplifier circuit 13 as follows.

FIG. 6 illustrates an example configuration of the time difference amplifier circuit 13 which has been improved for achieving lower power consumption and shorter initialization time. In each of the basic circuits 130, the inverter circuit 133A is arranged so as to be power controlled by an output signal of the inverter circuit 132A of the next basic circuit 130 which receives the output signal of the inverter circuit 132A of that basic circuit 130. Specifically, the inverter circuit 133A is coupled to the supply voltage or to ground from when the signal ø2 is input to the time difference amplifier circuit 13 until the output signal of the inverter circuit 132A of the next basic circuit 130 transitions, and the inverter circuit 133A is isolated from the supply voltage or from ground after the output signal of the inverter circuit 132A of the next basic circuit 130 transitions. In addition, the inverter circuit 134A is arranged so as to be power controlled by an output signal of the inverter circuit 131A of the next basic circuit 130 which receives the output signal of the inverter circuit 131A of that basic circuit 130. Specifically, the inverter circuit 134A is coupled to the supply voltage or to ground from when the signal ø1 is input to the time difference amplifier circuit 13 until the output signal of the inverter circuit 131A of the next basic circuit 130 transitions, and the inverter circuit 134A is isolated from the supply voltage or from ground after the output signal of the inverter circuit 131A of the next basic circuit 130 transitions.

Figure 7A:
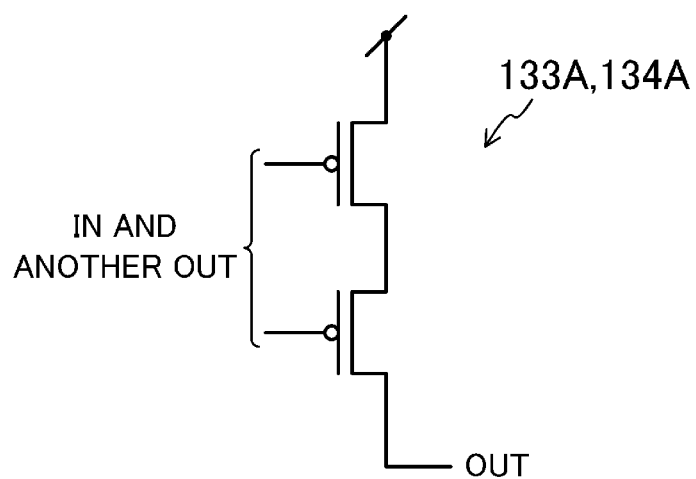
FIGS. 7A and 7B each illustrate an example configuration of inverter circuits which output inverse logic values for causing signal collision.
Figure 7B:
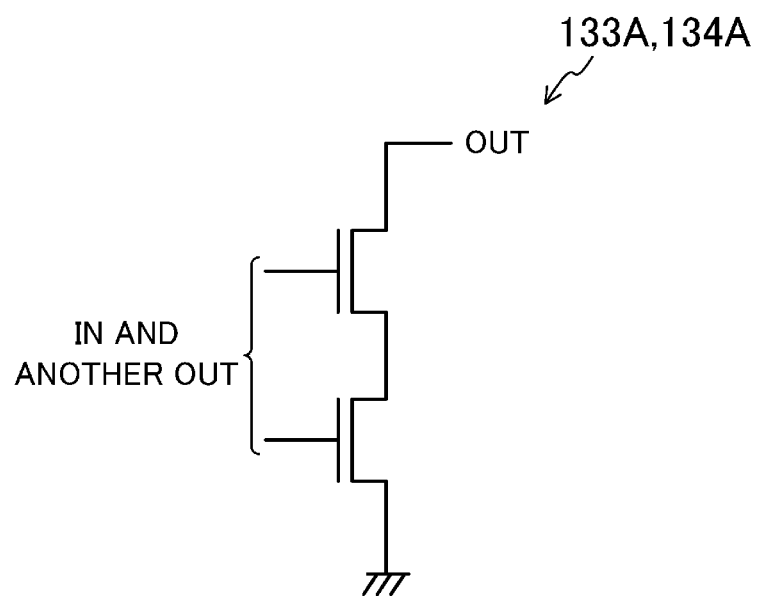

FIGS. 7A and 7B each illustrate an example configuration of the inverter circuits 133A and 134A. If the inverter circuits 133A and 134A each output a high logic (H) level to delay output transitions of the inverter circuits 131A and 132A, then, as shown in FIG. 7A, the inverter circuits 133A and 134A can be formed by two PMOS transistors coupled in series. The source of one transistor is coupled to the supply voltage, and the drain of the other transistor outputs an H level. On the contrary, if the inverter circuits 133A and 134A each output a low logic (L) level to delay output transitions of the inverter circuits 131A and 132A, then, as shown in FIG. 7B, the inverter circuits 133A and 134A can be formed by two NMOS transistors coupled in series. The source of one transistor is coupled to ground, and the drain of the other transistor outputs an L level. In both configurations, the gates of the two transistors are respectively coupled to the input signal of the inverter circuit 131A of that basic circuit 130 and to the output signal of the inverter circuit 132A of another basic circuit 130 in the inverter circuit 133A, and are respectively coupled to the input signal of the inverter circuit 132A of that basic circuit 130 and to the output signal of the inverter circuit 131A of another basic circuit 130 in the inverter circuit 134A. The combination of the signals and the gates of the transistors to couple the signals is arbitrary.

Note that the signal for controlling the inverter circuit 133A is not limited to the output signal of the inverter circuit 132A of the next basic circuit 130, but may also be the output signal of the inverter circuit 132A of an inverter circuit 130 located apart. That is, the inverter circuit 133A may be power controlled by a transmitted signal of the output signal of an inverter circuit 132A. Similarly, the inverter circuit 134A may be power controlled by a transmitted signal of the output signal of an inverter circuit 131A.

As described above, isolating both the inverter circuits 133A and 134A of a basic circuit 130 from the power supply and ground after the signals ø1 and ø2 have passed through that basic circuit 130 prevents the shoot-through current from continuing to flow in a stationary state in which the signals ø1 and ø2 are input. The configuration of FIG. 6 has an effect on reducing power consumption approximately ten times that of the configuration of FIG. 5.

Returning again to FIG. 6, in each of the basic circuits 130, the inverter circuits 131A and 132A are arranged so as to be initialized by the signal R or/R, which is the inverse of R. The cascaded inverter circuits 131A are alternately initialized by the signal R and/R because the initial values of these inverter circuits 131A alternately change. A similar argument applies to initialization of the inverter circuits 132A.

Figure 8A:
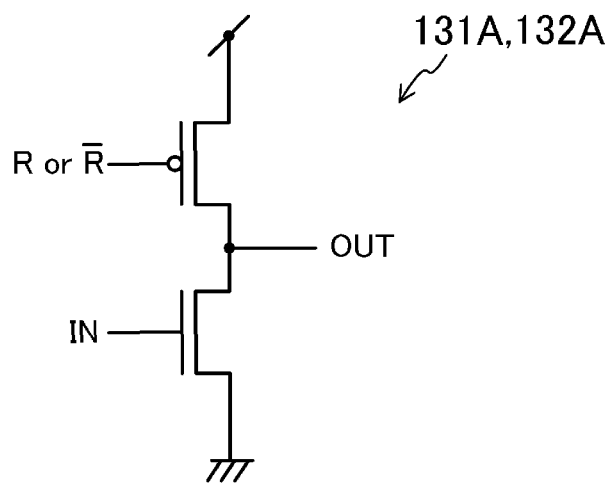
FIGS. 8A and 8B each illustrate an example configuration of inverter circuits for signal transmission.
Figure 8B:
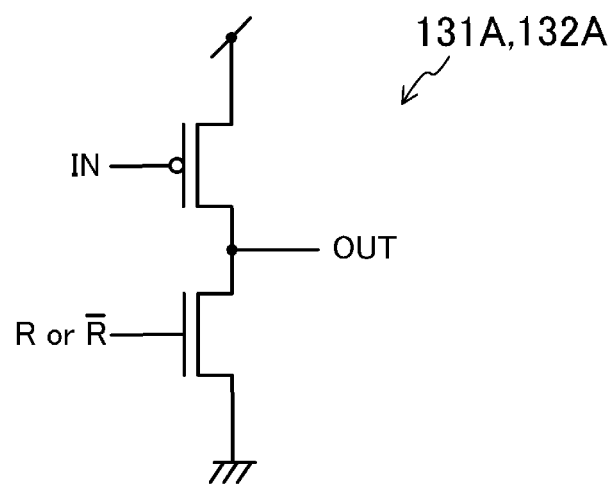

FIGS. 8A and 8B each illustrate an example configuration of the inverter circuits 131A and 132A. If the initial values of the inverter circuits 133A and 134A are at a high logic level, then, as shown in FIG. 8A, it is preferred that the gate of the PMOS transistor included in each of the inverter circuits 131A and 132A be coupled to the signal R or/R. On the contrary, the initial values of the inverter circuits 133A and 134A are at a low logic level, then, as shown in FIG. 8B, it is preferred that the gate of the NMOS transistor included in each of the inverter circuits 131A and 132A be coupled to the signal R or/R.

As described above, initialization of all the inverter circuits 131A and 132A all at once with either the signal R or/R allows the time difference amplifier circuit 13 to be initialized with a delay time of slightly more than one gate. That is, adoption of the configuration of FIG. 6 allows the initialization time of the time difference amplifier circuit 13 to be significantly reduced.

The time difference amplifier circuit disclosed in Non-Patent Document 2 controls the gain by controlling the current source of the variable delay cells. However, due to a relatively small linear region of the current source, such a configuration makes it difficult to design a time difference amplifier circuit having high linearity. In contrast, since the time difference amplifier circuit 13 provides delays in outputs by utilizing collisions of signals output from the inverter circuits, a time difference amplification operation with high linearity can be achieved over a wide range.

Returning again to FIG. 1, the delay adjustment circuit 14 is configured to receive the signals ø1' and ø2', to add to these signals a phase difference dependent on the signal D output from the time-to-digital conversion circuit 11, and to output the resultant signals ø1" and ø2". FIG. 9 illustrates an example configuration of the delay adjustment circuit 14 in a 1.5-bit stage. The delay circuits 141 and 142 are respectively configured to delay the input signals ø1' and ø2' by an amount of time T, and to output the delayed signals. Each of the delay circuits 141 and 142 can be formed by four of the delay circuits 111 or 112 shown in FIG. 2 coupled in series. A delay selection circuit 143 is configured to selectively output either the input signal or the output signal of the delay circuit 141 based on D[1]. A delay selection circuit 144 is configured to selectively output either the input signal or the output signal of the delay circuit 142 based on D[0].

For example, if the value of the signal D is "01," that is, the signal ø1 lags the signal ø2 by T/4 or more, then the delay selection circuit 143 outputs the signal ø1', and the delay selection circuit 144 outputs the output signal of the delay circuit 142. If the value of the signal D is "00," that is, the phase difference between the signals ø1 and ø2 is within ±T/4, then the delay selection circuits 143 and 144 respectively output the signals ø1' and ø2'. And, if the value of the signal D is "10," that is, the signal ø1 leads the signal ø2 by T/4 or more, then the delay selection circuit 143 outputs the output signal of the delay circuit 141, and the delay selection circuit 144 outputs the signal ø2'.

Figure 10:
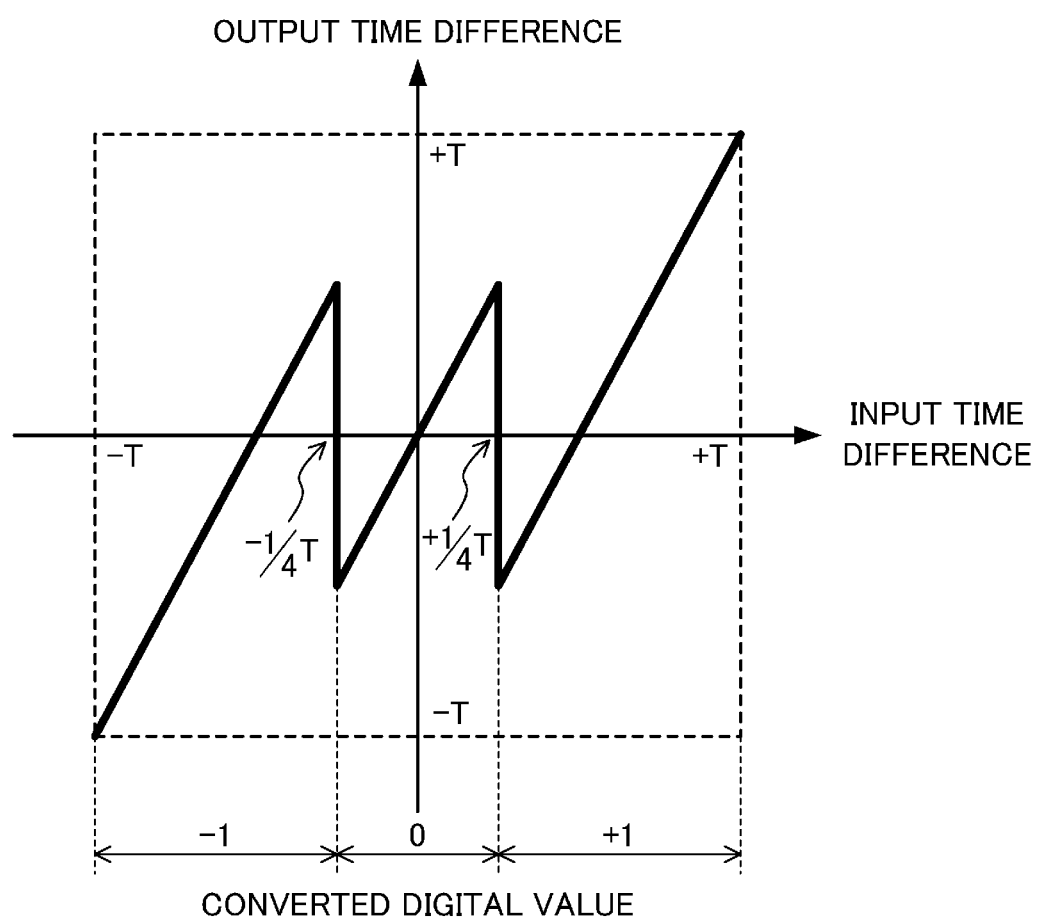
FIG. 10 illustrates a graph of a relationship between the input-output characteristic and the converted digital value of the 1.5-bit time-to-digital conversion stage.

FIG. 10 illustrates a relationship between the input-output characteristic and the converted digital value of the 1.5-bit time-to-digital conversion stage 10. The input time difference is the phase difference between the signals ø1 and ø2, and the output time difference is the phase difference between the signals ø1" and ø2".

Figure 11:
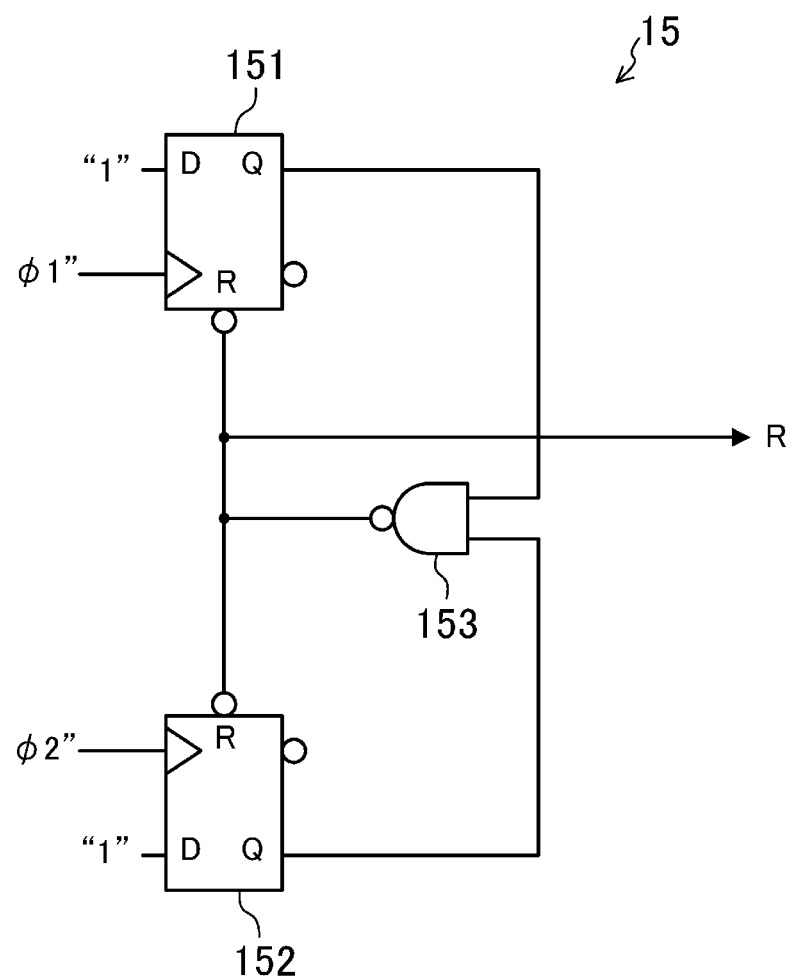
FIG. 11 illustrates an example configuration of the output detection circuit.

Returning again to FIG. 1, the output detection circuit 15 is configured to detect that the delay adjustment circuit 14 has output the signals ø1" and ø2", and to output the signal R. FIG. 11 illustrates an example configuration of the output detection circuit 15. Trigger circuits 151 and 152 are configured to output "0" until rising edges of the signals ø1" and ø2" are respectively input thereto, and to output "1" when rising edges are input thereto. The trigger circuits 151 and 152 can both be formed by D flip-flops. A logic circuit 153 is configured to output the result of a NAND operation on the output signals of the trigger circuits 151 and 152. The output signal of the logic circuit 153 is the signal R. The logic circuit 153 can be formed by a NAND gate. The trigger circuits 151 and 152 are reset by receiving the signal R, and then again output "0." That is, the signal R can be a timing signal indicating a completion of conversion process by the time-to-digital conversion stage 10. For example, the signal R can be used as a signal indicating a latch timing of the signal D by the storage circuit 12. Alternatively, the signal R can be used as a reset signal for the phase comparison circuits 113 and 114 shown in FIG. 2.

Example of 2.5-Bit Stage

A case will be described in which the resolution of the time-to-digital conversion stage 10 is 2.5 bits. In the case of a 2.5-bit stage, the signal D is 3-bit wide, and thus the bit width of the storage circuit 12 needs to be extended accordingly. Moreover, the time difference amplifier circuit 13 needs to output the signals ø1' and ø2' which each have a phase difference four times larger than that between the signals ø1 and ø2. Furthermore, the configurations of the time-to-digital conversion circuit 11 and of the delay adjustment circuit 14 are different from those described above.

Figure 12:
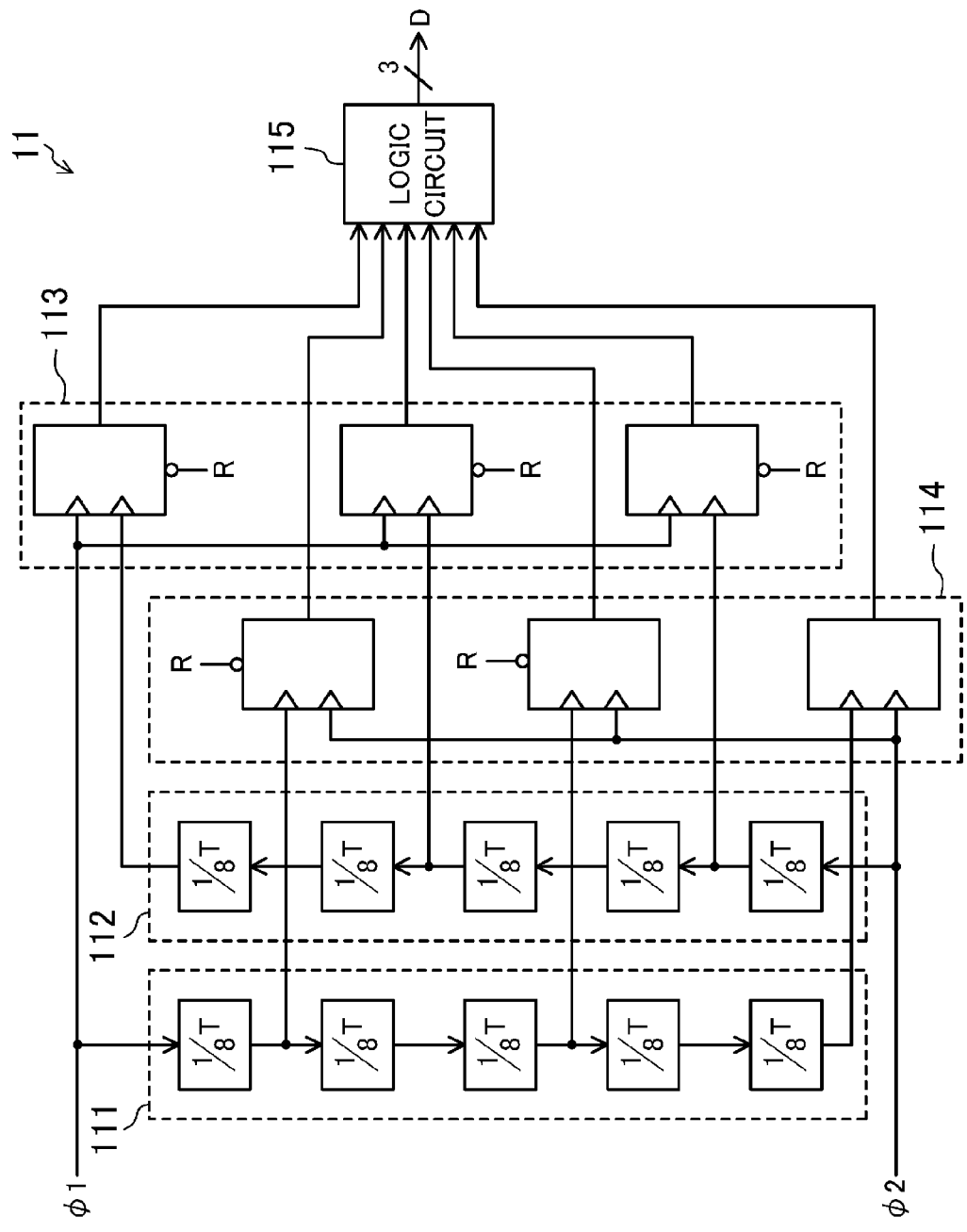
FIG. 12 illustrates an example configuration of the time-to-digital conversion circuit in a 2.5-bit stage.

The time-to-digital conversion circuit 11 is configured to output a signal D which represents one of "−3," "−2," "−1," "0," "+1," "+2," and "+3" based on the phase difference between the input signals ø1 and ø2. FIG. 12 illustrates an example configuration of the time-to-digital conversion circuit 11 in a 2.5-bit stage. The delay circuits 111 and 112 are respectively configured to delay the input signals ø1 and ø2 by amounts of time of T/8, 3T/8, and 5T/8 (where ±T is the maximum time difference which is convertible by the time-to-digital conversion stage 10), and to output the delayed signals. Each of the delay circuits 111 and 112 can be formed by five delay elements each providing an amount of delay of T/8, coupled in series. The phase comparison circuit 113 is configured to detect whether each of the output signals delayed by the amounts of time T/8, 3T/8, and 5T/8 of the delay circuit 112 leads or lags the signal ø1 in phase. The phase comparison circuit 114 is configured to detect whether each of the output signals delayed by the amounts of time T/8, 3T/8, and 5T/8 of the delay circuit 111 leads or lags the signal ø2 in phase. The phase comparison circuits 113 and 114 are both configured to be initialized by the signal R. The phase comparison circuits 113 and 114 can both be formed by a plurality of RS flip-flops having a reset function, etc. A logic circuit 115 is configured to generate a three-bit signal D from the output signals from the phase comparison circuits 113 and 114.

Figure 13:
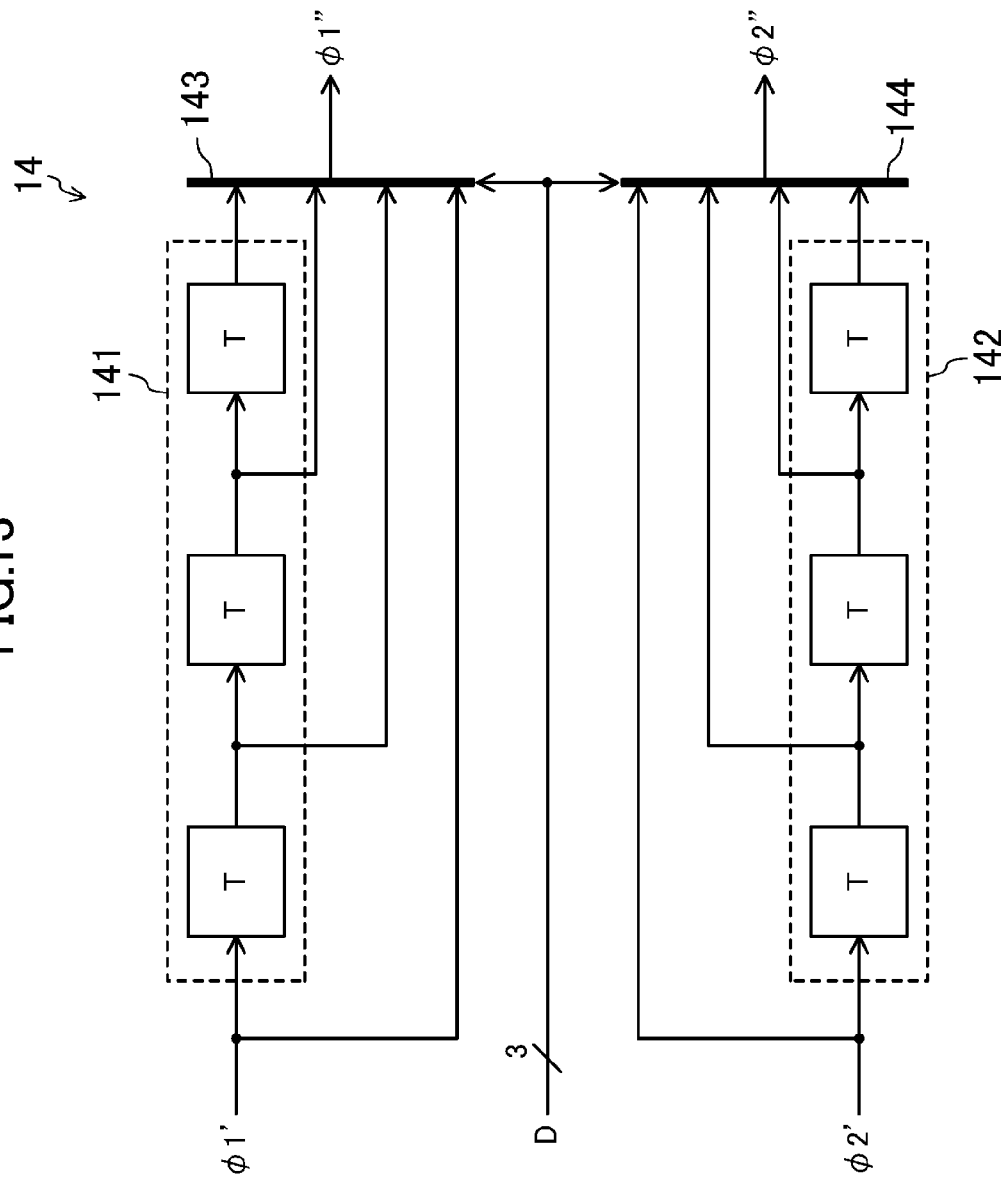
FIG. 13 illustrates an example configuration of the delay adjustment circuit in a 2.5-bit stage.

FIG. 13 illustrates an example configuration of the delay adjustment circuit 14 in a 2.5-bit stage. The delay circuits 141 and 142 are respectively configured to delay the input signals ø1' and ø2' by amounts of time of T, 2T, and 3T, and to output the delayed signals. Each of the delay circuits 141 and 142 can be formed by three delay elements each providing an amount of delay of T, coupled in series. In addition, the delay elements providing the amount of delay of T can be formed by eight of the delay elements shown in FIG. 12 each providing the amount of delay of T/8, coupled in series. Each of the delay selection circuits 143 and 144 is configured to selectively output one of the input signal and the output signals of the corresponding one of the delay circuits 141 and 142, based on the signal D.

For example, if the value of the signal D is "−3" ("101" in the form of two's complement), that is, the signal ø1 lags the signal ø2 by 5T/8 or more, then the delay selection circuit 143 outputs the signal ø1', and the delay selection circuit 144 outputs the output signal delayed by 3T of the delay circuit 142. If the value of the signal D is "0" ("000" in the form of two's complement), that is, the phase difference between the signals ø1 and ø2 is within ±T/8, then the delay selection circuits 143 and 144 respectively output the signals ø1' and ø2'. And, if the value of the signal D is "+3" ("011" in the form of two's complement), that is, the signal ø1 leads the signal ø2 by 5T/8 or more, then the delay selection circuit 143 outputs the output signal delayed by 3T of the delay circuit 141, and the delay selection circuit 144 outputs the signal ø2'.

Figure 14:
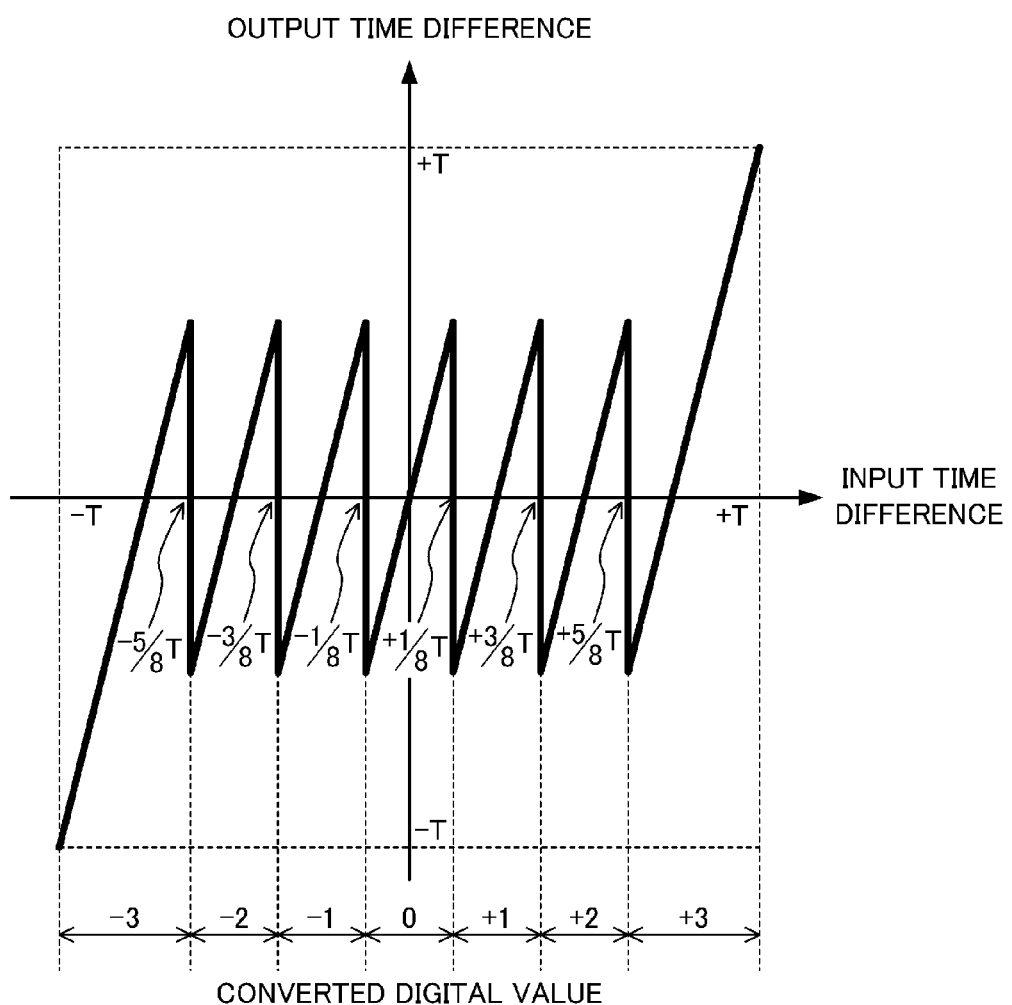
FIG. 14 illustrates a graph of a relationship between the input-output characteristic and the converted digital value of the 2.5-bit time-to-digital conversion stage.

FIG. 14 illustrates a relationship between the input-output characteristic and the converted digital value of the 2.5-bit time-to-digital conversion stage 10. The input time difference is the phase difference between the signals ø1 and ø2, and the output time difference is the phase difference between the signals ø1" and ø2".

Example of 3.5 or More-Bit Stage

A multi-bit stage of 3.5 or more bits can be formed by modifying the time-to-digital conversion circuit 11, the time difference amplifier circuit 13, and the delay adjustment circuit 14 as follows. That is, if the signal D is an n-bit signal representing an integer value ranging from $-(2^{n-1}-1)$ to $+(2^{n-1}-1)$, the time difference amplifier circuit 13 is configured to amplify the phase difference between the signals ø1 and ø2 $2^{n-1}$ times, and to output the signals ø1' and ø2' having the amplified phase difference therebetween. In addition, in the time-to-digital conversion circuit 11, the delay circuits 111 and 112 are respectively configured to delay the signals ø1 and ø2 by amounts of time equivalent to $(2i-1)/2^n$ times (where "i" is each integer satisfying $1 \leq i \leq 2^{n-1}-1$) the amount of time T, and to output the delayed signals. Each of the phase comparison circuits 113 and 114 is configured to detect whether each of the output signals of the corresponding one of the delay circuits 111 and 112 leads or lags the corresponding one of the signals ø1 and ø2 in phase. In the delay adjustment circuit 14, the delay circuits 141 and 142 are respectively configured to delay the signals ø1' and ø2' by amounts of time equivalent to i times the amount of time T, and to output the delayed signals. Each of the delay selection circuits 143 and 144 is configured to selectively output one of the input signal and the output signals of the corresponding one of the delay circuits 141 and 142.

Example of One-Bit Stage

A case will be described in which the resolution of the time-to-digital conversion stage 10 is one bit. In the case of a one-bit stage, the time-to-digital conversion circuit 11 can be formed by one phase comparison circuit configured to output a one-bit digital signal based on whether the signal ø1 leads or lags the signal ø2 in phase. The time difference amplifier circuit 13 is configured to amplify the phase difference between the signals ø1 and ø2 m times (where m is equal to or less than two), and to output the signals ø1' and ø2' having the amplified phase difference therebetween. If m is set to a value more than two, then, in a one-bit stage, a gain error, an offset error, etc. in the time difference amplifier circuit 13 might cause the upper or the lower peak of the output time difference to be clipped when the input time difference is nearly zero. The purpose of controlling the gain value of the time difference amplifier circuit 13 so as not to exceed two is to prevent such information loss in the output time difference.

Figure 15:
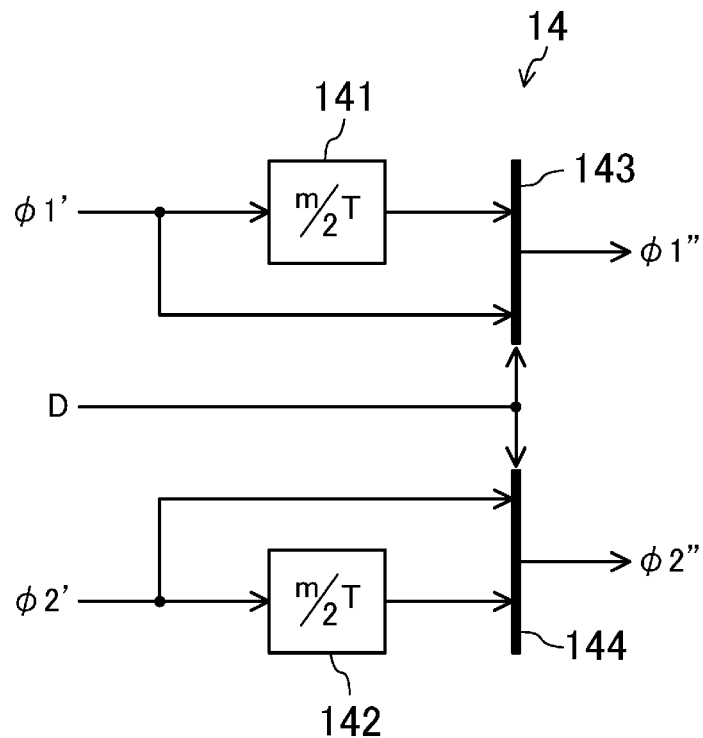
FIG. 15 illustrates an example configuration of the delay adjustment circuit in a one-bit stage.

FIG. 15 illustrates an example configuration of the delay adjustment circuit 14 in a one-bit stage. The delay circuits 141 and 142 are respectively configured to delay the input signals ø1' and ø2' by an amount of time of mT/2, and to output the delayed signals. The delay selection circuit 143 is configured to selectively output either the input signal or the output signal of the delay circuit 141 based on the signal D. The delay selection circuit 144 is configured to selectively output either the input signal or the output signal of the delay circuit 142 based on the signal D. For example, if the value of the signal D is "0," that is, the signal ø1 lags the signal ø2, then the delay selection circuit 143 outputs the signal ø1', and the delay selection circuit 144 outputs the output signal of the delay circuit 142. And, if the value of the signal D is "1," that is, the signal ø1 leads the signal ø2, then the delay selection circuit 143 outputs the output signal of the delay circuit 141, and the delay selection circuit 144 outputs the signal ø2'.

Figure 16:
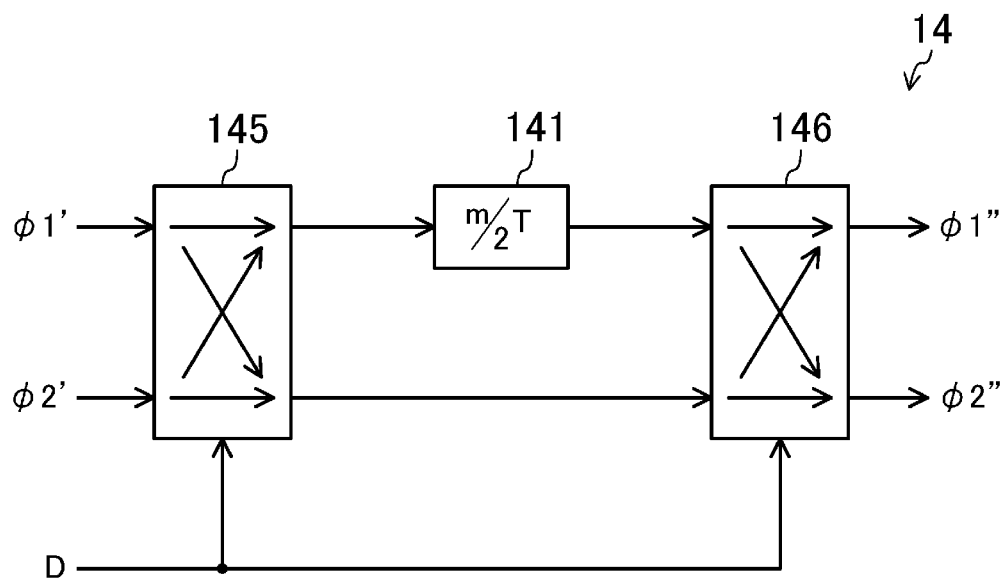
FIG. 16 illustrates another example configuration of the delay adjustment circuit in a one-bit stage.

FIG. 16 illustrates another example configuration of the delay adjustment circuit 14 in a one-bit stage. A swap circuit 145 is configured to receive the signals ø1' and ø2', to interchange the signals ø1' and ø2' based on the signal D, and to output the resultant signals. The delay circuit 141 is configured to delay one of the output signals of the swap circuit 145 by the amount of time of mT/2, and to output the delayed signal. A swap circuit 146 is configured to receive the output signal of the delay circuit 141 and the other of the output signals of the swap circuit 145, to interchange these signals based on the signal D, and to output the resultant signals as the signals ø1" and ø2". For example, if the value of the signal D is "0," that is, the signal ø1 lags the signal ø2, then the signal ø1' input to the swap circuit 145 is output as the signal ø1" without delay, and the signal ø2' is delayed in the delay circuit 141, and is output as the signal ø2", both from the swap circuit 146. If the value of the signal D is "1," that is, the signal ø1 leads the signal ø2, then the signal ø1' input to the swap circuit 145 is delayed in the delay circuit 141, and is output as the signal or, and the signal ø2' is output as the signal ø2" without delay, both from the swap circuit 146.

Figure 17:
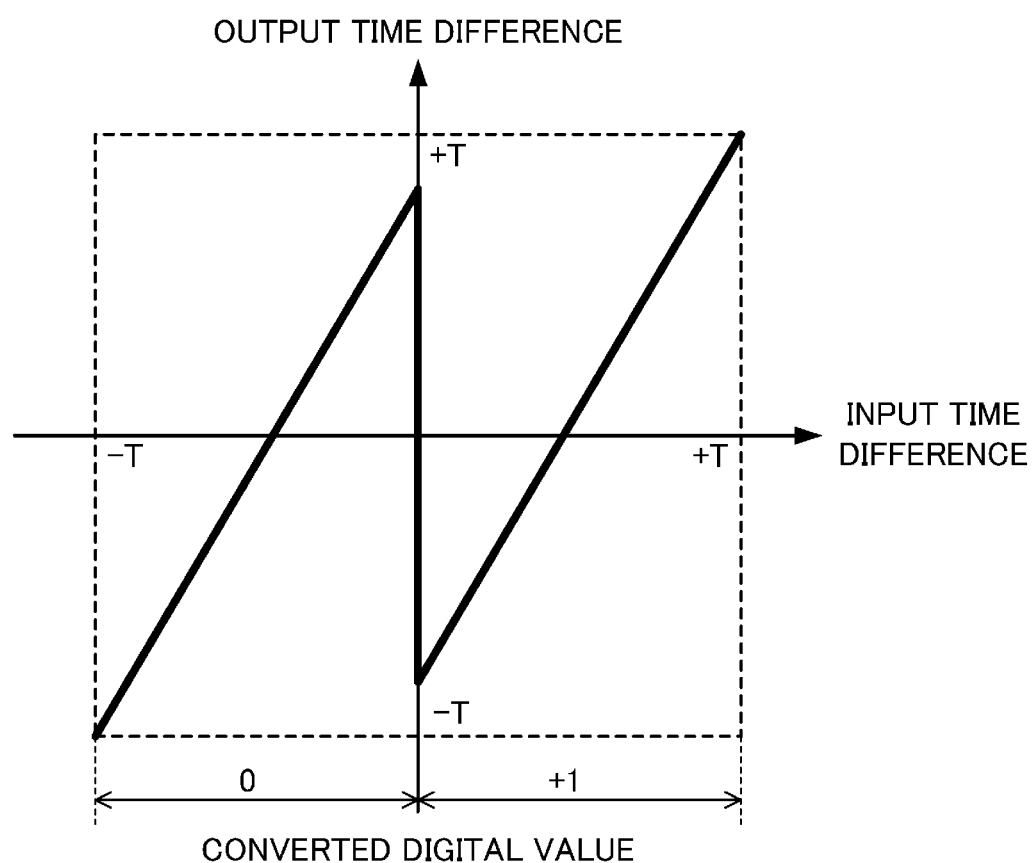
FIG. 17 illustrates a graph of a relationship between the input-output characteristic and the converted digital value of the one-bit time-to-digital conversion stage.

FIG. 17 illustrates a relationship between the input-output characteristic and the converted digital value of the one-bit time-to-digital conversion stage 10. The input time difference is the phase difference between the signals ø1 and ø2, and the output time difference is the phase difference between the signals ø1" and ø2". Here, since the gain value of the time difference amplifier circuit 13 is set to about 1.8, the output time difference is slightly below ±T when the input time difference is zero.

As described above, this embodiment achieves a time-to-digital conversion stage which is applicable as each stage in a pipeline and a cyclic time-to-digital converters which are small and can implement high-resolution time-to-digital conversion.

Figure 18:
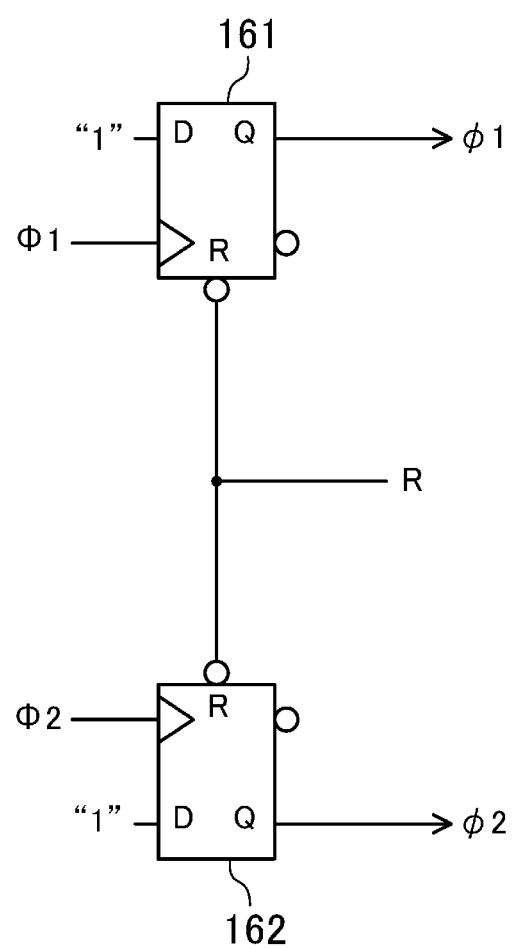
FIG. 18 illustrates an example configuration of a wave shaping circuit.

Note that it is preferable that the signals ø1 and ø2 be each a step signal which makes no logic transitions until the signals ø1" and ø2" are output once the signals ø1 and ø2 are input to the time-to-digital conversion stage 10. In particular, it is likely that, in the time difference amplifier circuit 13 having the configuration shown in FIG. 3, transitions of the logic levels of the signals ø1 and ø2 during an amplification process prevent delays of the output transition of the inverter circuits 131 and 132 from occurring in basic circuits 130 in later stages along the signal paths, thereby causing accurate time difference amplification to fail. Accordingly, it is preferable that a wave shaping circuit be provided which fixes the logic levels of the signals ø1 and ø2 until signal processing in the time-to-digital conversion stage 10 completes. FIG. 18 illustrates an example configuration of a wave shaping circuit. Signals Ø1 and Ø2 are original signals of the signals ø1 and ø2, respectively. The signals Ø1 and Ø2 may be pulses. The wave shaping circuits 161 and 162 are configured to output "0" respectively as the signals ø1 and ø2 until rising edges of the signals Ø1 and Ø2 are input, and to output "1" when the rising edges are input. In addition, the wave shaping circuits 161 and 162 are configured to be reset by receiving the signal R, and to again output "0" as the signals ø1 and ø2. The wave shaping circuits 161 and 162 can be formed by D flip-flops.

Embodiment of Pipeline Time-to-Digital Converter

Figure 19:
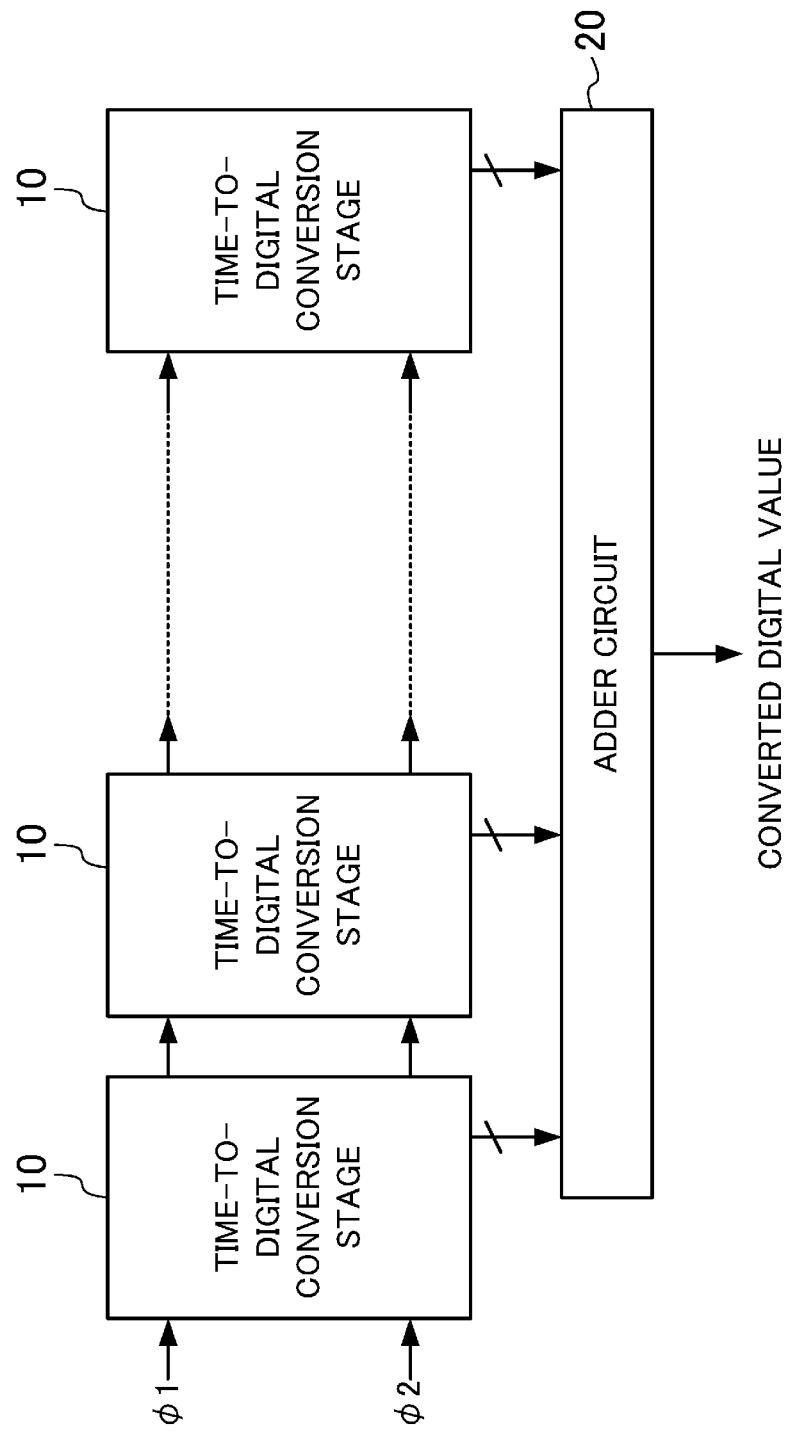
FIG. 19 illustrates a configuration of a pipeline time-to-digital converter according to an embodiment of the present teaching.

FIG. 19 illustrates a configuration of a pipeline time-to-digital converter according to an embodiment of the present teaching. The pipeline time-to-digital converter includes a plurality of the time-to-digital conversion stages 10 described above, coupled in a multi-stage manner. Each of the time-to-digital conversion stages 10 is configured to convert the phase difference between the two signals output from the previous stage (the signals ø1 and ø2 for the first time-to-digital conversion stage 10) into a digital value of several bits, and to output the digital value, and is configured to amplify and adjust the phase difference between these two signals, and to output the two resultant signals. An adder circuit 20 is configured to shift the digits of the digital values output from the respective time-to-digital conversion stages 10 with respect to one another, and to add up the shifted digital values. The adder circuit 20 can be formed by an appropriate combination of full-adders and/or half-adders.

According to this embodiment, multi-stage coupling of the time-to-digital conversion stages 10 achieves high-resolution time-to-digital conversion. That is, a small-sized high-resolution time-to-digital converter can be achieved without need for a larger number of time difference amplifier circuits than the number of stages, and for an additional time-to-digital converter for converting the phase difference between the output signals from these time difference amplifier circuits.

Variation

Since the time-to-digital conversion stages 10 converts analog temporal information into digital values, internal operations are asynchronous, and thus the time needed for signal processing differs from stage to stage. Accordingly, a mechanism is required, in each of the time-to-digital conversion stages 10, for preventing the value stored in the storage circuit 12 from being overwritten until the process in the adder circuit 20 completes, and, in the pipeline time-to-digital converter, for reading and adding up the values stored in the storage circuits 12 in the respective time-to-digital conversion stages 10 each time the detection signal R is output from the last stage.

Figure 20:
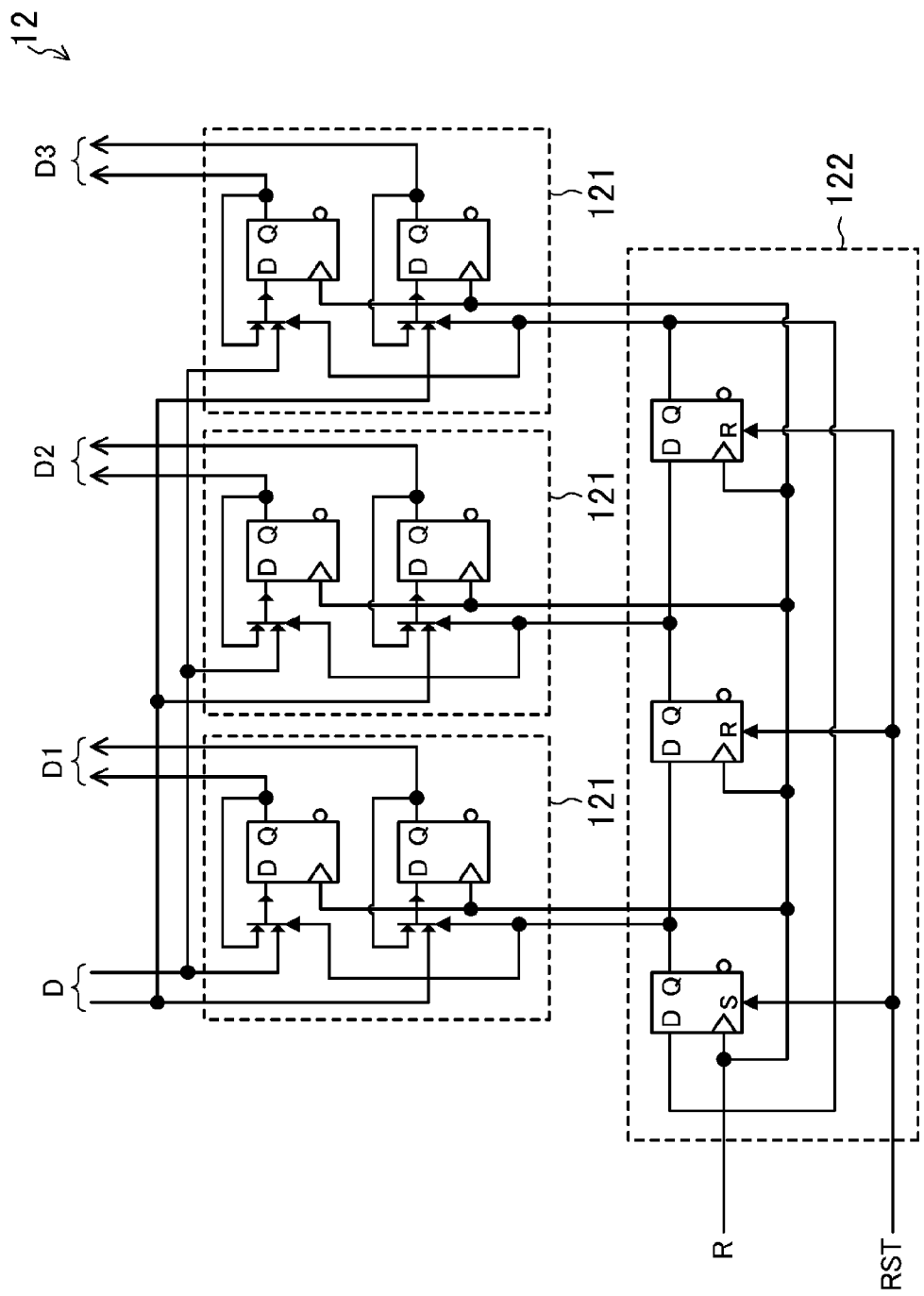
FIG. 20 illustrates an example configuration of the storage circuit in a 1.5-bit stage.

FIG. 20 illustrates an example configuration of the storage circuit 12 in a 1.5-bit stage. Three register circuits 121 are configured to latch the two-bit signal D in synchronism with the signal R, and to respectively output two-bit signals D1, D2, and D3. It is preferable that the number of the register circuits 121 to be installed be the same as the number of the stages in the pipeline time-to-digital converter. In this example, a pipeline time-to-digital converter having three 1.5-bit stages coupled is assumed. A register selection circuit 122 is configured to select one of the three register circuits 121 in synchronism with the signal R as the storage unit of the signal D. The register selection circuit 122 can be formed by three shift registers whose first stage is set by a reset signal RST.

Figure 21:
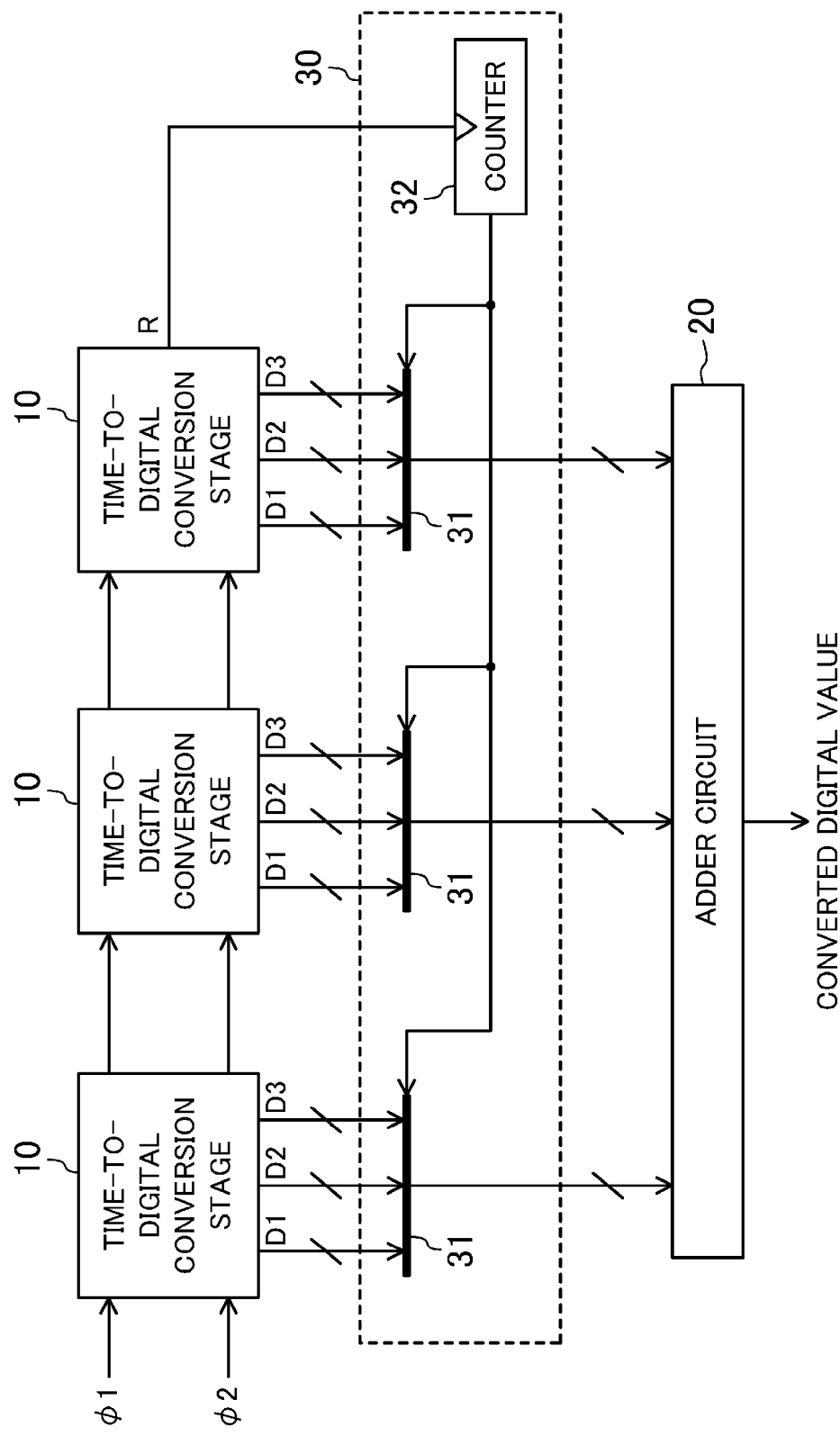
FIG. 21 illustrates a configuration of a pipeline time-to-digital converter according to a variation.

FIG. 21 illustrates a configuration of a pipeline time-to-digital converter according to a variation. A signal selection circuit 30 is configured to selectively output one of the digital signals D1, D2, and D3 of each of the time-to-digital conversion stages 10 in synchronism with the signal R output from the last one of the time-to-digital conversion stages 10. Specifically, the signal selection circuit 30 can be formed by three selection circuits 31 configured to select one of the digital output signals of the corresponding stage, and a counter circuit 32 configured to count the signal R, which is a pulse signal. That is, if the count value of the counter circuit 32 is "1," then the selection circuits 31 each select the signal D1. If the count value is "2," then the selection circuits 31 each select the signal D2. And, if the count value is "3," then the selection circuits 31 each select the signal D3. According to this variation, the converted digital values of the respective stages are read and added up immediately after each signal processing of the last stage completes, thereby allowing the input rate to be improved.

Embodiment of Cyclic Time-to-Digital Converter

Figure 22:
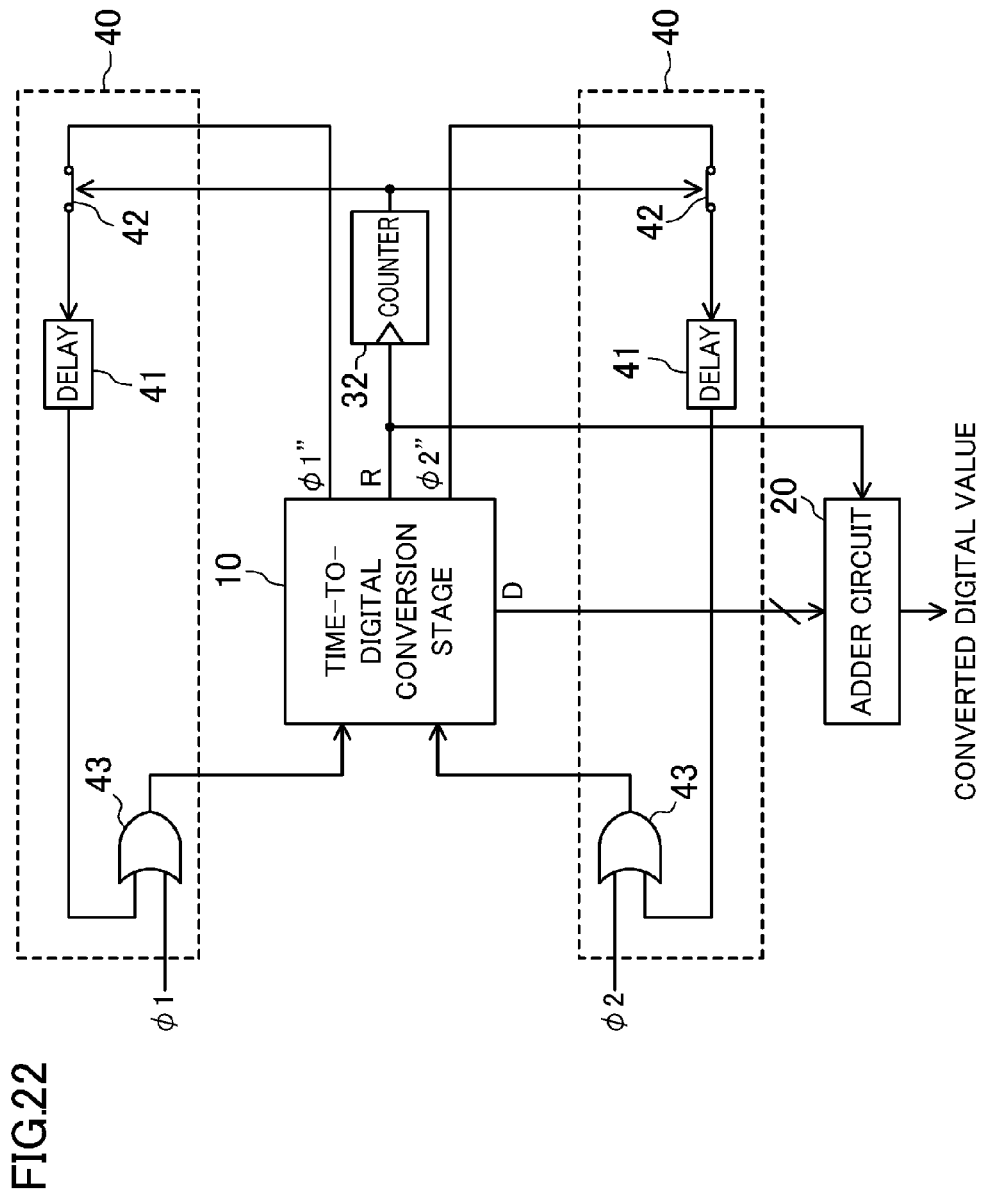
FIG. 22 illustrates a configuration of a cyclic time-to-digital converter according to an embodiment of the present teaching.

FIG. 22 illustrates a configuration of a cyclic time-to-digital converter according to an embodiment of the present teaching. In the cyclic time-to-digital converter, the signals ø1" and ø2" output from the time-to-digital conversion stage 10 described above are respectively fed back to the inputs thereof through two feedback paths 40. Each of the feedback paths 40 includes a delay circuit 41, a switch circuit 42, and an OR gate 43. The delay circuits 41 are respectively configured to receive the signals ø1' and ø2" output from the time-to-digital conversion stage 10, to delay these signals, and to output the delayed signals. Each of the OR gates 43 is configured to generate a logical sum of the signal ø1 or ø2 and the output signal of the corresponding delay circuit 41, and to input the logical sum to the time-to-digital conversion stage 10. Each of the switch circuit 42 is configured to switch the electrical continuity/discontinuity of the feedback path 40 according to the control of the counter circuit 32. Each of the switch circuit 42 conducts current while cyclic signal processing is performed by the time-to-digital conversion stage 10, and does not conduct current after the processing completes.

The switching operations of the switch circuits 42 are controlled by the counter circuit 32. The counter circuit 32 is configured to control the switch circuits 42 so as to conduct current until the counter circuit 32 counts the signal R output from the time-to-digital conversion stage 10 to a predetermined number, and to control the switch circuits 42 so as not to conduct current when the predetermined number has been reached. That is, the counter circuit 32 detects that cyclic signal processing completes, and then disconnects the feedback paths 40. The adder circuit 20 is configured to latch the signals D in synchronism with the signal R output from the time-to-digital conversion stage 10, to shift the digits of the latched digital values with respect to one another, and to add up the shifted digital values. The adder circuit 20 can be formed by an appropriate combination of full-adders and/or half-adders.

According to this embodiment, a conversion resolution similar to that of a pipeline time-to-digital converter can be achieved with a smaller circuit size.

Variation 5

Figure 23:
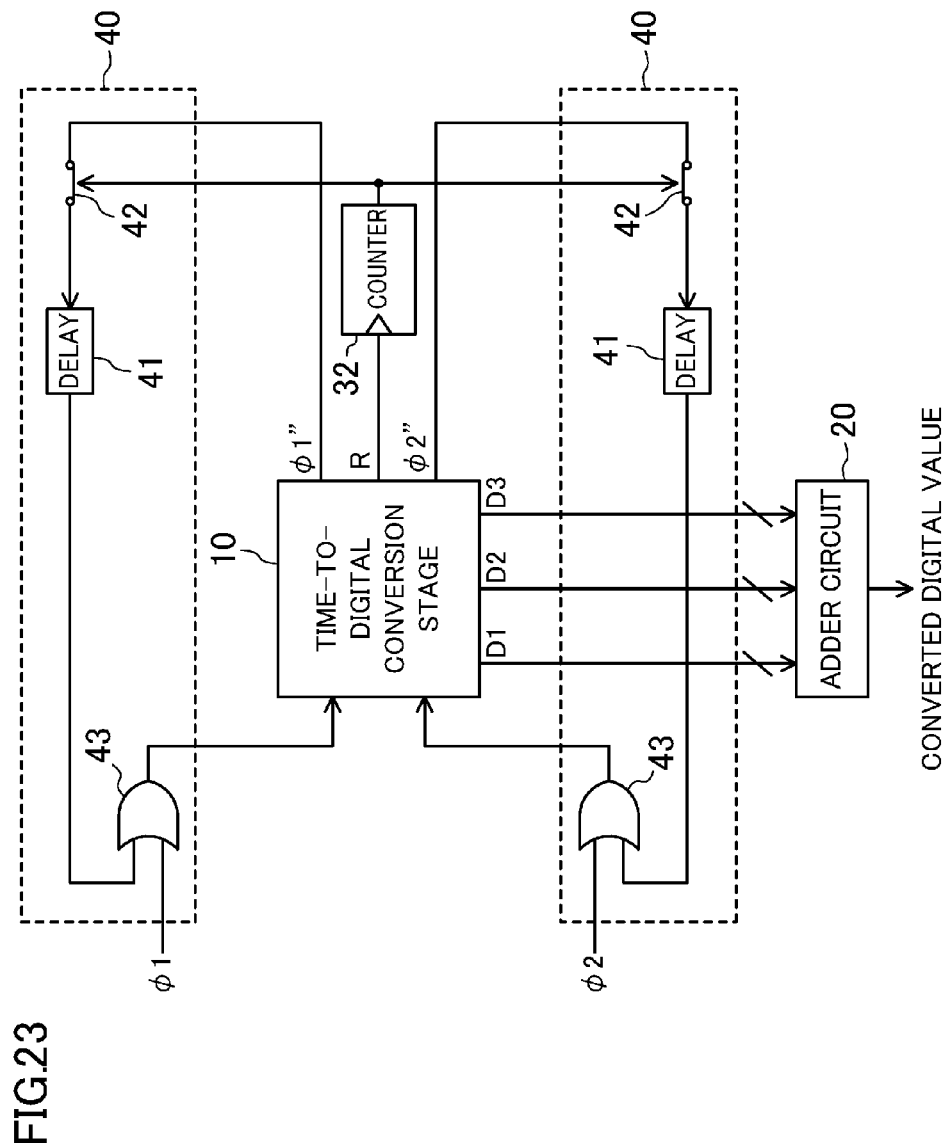
FIG. 23 illustrates a configuration of a cyclic time-to-digital converter according to a variation.

A similar variation is also possible for cyclic time-to-digital converters as the variation of the pipeline time-to-digital converter described above. FIG. 23 illustrates a configuration of a cyclic time-to-digital converter according to a variation. The time-to-digital conversion stage 10 has a function to hold and output a plurality of digital signals (three digital signals D1, D2, and D3 in this example). The adder circuit 20 is configured to shift the digits of the digital values output from the time-to-digital conversion stage 10 with respect to one another, and to add up the shifted digital values.

Note that if, in the pipeline and the cyclic time-to-digital converters, one or more one-bit stages having a gain value of the time difference amplifier circuit 13 of m (where m is less than 2) are used as the time-to-digital conversion stages 10, then the computation result of the adder circuit 20 is not a binary number. Thus, the computation result of the adder circuit 20 needs to be converted into a binary number.

Other implementations are contemplated.

What is claimed is:

1. A time-to-digital conversion stage, comprising:
a time-to-digital conversion circuit configured to output a digital signal having an n-bit width, which represents an integer value ranging from $-(2^{n-1}-1)$ to $+(2^{n-1}-1)$, based on a phase difference between a first and a second signals input thereto;
a time difference amplifier circuit configured to receive the first and the second signals, to amplify the phase difference between the first and the second signals received $2^{n-1}$ times, and to output two resultant signals having an amplified phase difference therebetween;
a delay adjustment circuit configured to receive the two resultant signals output from the time difference amplifier circuit, to add a phase difference dependent on the digital signal to the two resultant signals received, and to output another two resultant signals;
an output detection circuit configured to detect that the delay adjustment circuit has output the another two resultant signals, and to output a detection signal; and
a storage circuit configured to latch the digital signal in synchronism with the detection signal.

2. The time-to-digital conversion stage of claim 1, wherein the time-to-digital conversion circuit includes
a first and a second delay circuits each configured to delay an input signal by amounts of time equivalent to $(2i-1)/2^n$ times (where "i" is each integer satisfying $1 \leq i \leq 2^{n-1}-1$) a maximum time difference which is convertible by the time-to-digital conversion stage, and to output delayed signals, where the first and the second delay circuits respectively receive the first and the second signals as the input signal,
a first phase comparison circuit configured to detect whether each of output signals of the second delay circuit leads or lags the first signal in phase, and
a second phase comparison circuit configured to detect whether each of output signals of the first delay circuit leads or lags the second signal in phase.

3. The time-to-digital conversion stage of claim 2, wherein the time-to-digital conversion circuit includes
a logic circuit configured to generate the digital signal from output signals of the first and the second phase comparison circuits.

4. The time-to-digital conversion stage of claim 1, wherein the delay adjustment circuit includes
a first and a second delay circuits each configured to delay an input signal by amounts of time equivalent to i times (where "i" is each integer satisfying $1 \leq i \leq 2^{n-1}-1$) a maximum time difference which is convertible by the time-to-digital conversion stage, and to output delayed signals, where the first and the second delay circuits respectively receive the two resultant signals output from the time difference amplifier circuit as the input signal,
a first delay selection circuit configured to selectively output one of the input signal and the at least one output signal of the first delay circuit based on the digital signal, and
a second delay selection circuit configured to selectively output one of the input signal and the at least one output signal of the second delay circuit based on the digital signal.

5. A time-to-digital conversion stage, comprising:
a time-to-digital conversion circuit configured to output a digital signal having a one-bit width based on whether a first signal input thereto leads or lags a second signal input thereto in phase;
a time difference amplifier circuit configured to receive the first and the second signals, to amplify a phase difference between the first and the second signals received m times (where m is equal to or less than two), and to output two resultant signals having an amplified phase difference therebetween;
a delay adjustment circuit configured to receive the two resultant signals output from the time difference amplifier circuit, and to add a phase difference dependent on the digital signal to the two resultant signals received, and to output another two resultant signals;
an output detection circuit configured to detect that the delay adjustment circuit has output the another two resultant signals, and to output a detection signal; and
a storage circuit configured to latch the digital signal in synchronism with the detection signal.

6. The time-to-digital conversion stage of claim 5, wherein the delay adjustment circuit includes
a first and a second delay circuits each configured to delay an input signal by an amount of time equivalent to m/2 times a maximum time difference which is convertible by the time-to-digital conversion stage, and to output a delayed signal, where the first and the second delay circuits respectively receive the two resultant signals output from the time difference amplifier circuit,
a first delay selection circuit configured to selectively output either the input signal or an output signal of the first delay circuit based on the digital signal, and
a second delay selection circuit configured to selectively output either the input signal or an output signal of the second delay circuit based on the digital signal.

7. The time-to-digital conversion stage of claim 5, wherein the delay adjustment circuit includes
a first swap circuit configured to receive the two resultant signals output from the time difference amplifier circuit, to interchange the two resultant signals received based on the digital signal, and to output another resultant signals,
a delay circuit configured to receive one of output signals of the first swap circuit, to delay the signal received by an amount of time equivalent to m/2 times a maximum time difference which is convertible by the time-to-digital conversion stage, and to output a delayed signal, and a second swap circuit configured to receive both an output signal of the delay circuit and the other output signals of the first swap circuit, to interchange the signals received based on the digital signal, and to output another set of resultant signals.

8. The time-to-digital conversion stage of claim 1, wherein the time difference amplifier circuit includes an even number of basic circuits coupled in series, each having two inputs and two outputs, and each of the basic circuits includes a first, a second, a third, and a fourth inverter circuits, where inputs of the first and the third inverter circuits, inputs of the second and the fourth inverter circuits, outputs of the first and the fourth inverter circuits, and outputs of the second and the third inverter circuits are respectively shared, drive capabilities of the first and the second inverter circuits are the same, drive capabilities of the third and the fourth inverter circuits are the same, and are lower than that of the first and the second inverter circuits, and the input/output of the first inverter circuit is a first input/output, and the input/output of the second inverter circuit is a second input/output.

9. The time-to-digital conversion stage of claim 5, wherein the time difference amplifier circuit includes an even number of basic circuits coupled in series, each having two inputs and two outputs, and each of the basic circuits includes a first, a second, a third, and a fourth inverter circuits, where inputs of the first and the third inverter circuits, inputs of the second and the fourth inverter circuits, outputs of the first and the fourth inverter circuits, and outputs of the second and the third inverter circuits are respectively shared, drive capabilities of the first and the second inverter circuits are the same, drive capabilities of the third and the fourth inverter circuits are the same, and are lower than that of the first and the second inverter circuits, and the input/output of the first inverter circuit is a first input/output, and the input/output of the second inverter circuit is a second input/output.

10. The time-to-digital conversion stage of claim 8, wherein the third inverter circuit is a transistor having a first polarity, the transistor including a source provided with a first voltage, a gate coupled to the input of the first inverter circuit, and a drain coupled to the output of the second inverter circuit, and the fourth inverter circuit is a transistor having a second polarity, the transistor including a source provided with a second voltage, a gate coupled to the input of the second inverter circuit, and a drain coupled to the output of the first inverter circuit.

11. The time-to-digital conversion stage of claim 9, wherein the third inverter circuit is a transistor having a first polarity, the transistor including a source provided with a first voltage, a gate coupled to the input of the first inverter circuit, and a drain coupled to the output of the second inverter circuit, and the fourth inverter circuit is a transistor having a second polarity, the transistor including a source provided with a second voltage, a gate coupled to the input of the second inverter circuit, and a drain coupled to the output of the first inverter circuit.

12. The time-to-digital conversion stage of claim 8, wherein the third and the fourth inverter circuits are respectively power controlled by transmitted signals of the outputs of the second and the first inverter circuits.

13. The time-to-digital conversion stage of claim 9, wherein the third and the fourth inverter circuits are respectively power controlled by transmitted signals of the outputs of the second and the first inverter circuits.

14. The time-to-digital conversion stage of claim 8, wherein the first and the second inverter circuits are initialized by the detection signal.

15. The time-to-digital conversion stage of claim 9, wherein the first and the second inverter circuits are initialized by the detection signal.

16. The time-to-digital conversion stage of claim 1, wherein the output detection circuit includes a first and a second trigger circuits each configured to output a signal of a predetermined logical value when an input signal makes a predetermined logic transition, where the first and the second trigger circuits respectively receive the another two resultant signals output from the delay adjustment circuit as the input signal, and a logic circuit configured to output the detection signal when output signals of the first and the second trigger circuits both transition to the predetermined logical value.

17. The time-to-digital conversion stage of claim 5, wherein the output detection circuit includes a first and a second trigger circuits each configured to output a signal of a predetermined logical value when an input signal makes a predetermined logic transition, where the first and the second trigger circuits respectively receive the another two resultant signals output from the delay adjustment circuit as the input signal, and a logic circuit configured to output the detection signal when output signals of the first and the second trigger circuits both transition to the predetermined logical value.

18. The time-to-digital conversion stage of claim 1, comprising:

a first and a second wave shaping circuits each configured to output a signal of a predetermined logical value when an input signal makes a predetermined logic transition, and to stop outputting the signal of the predetermined logical value when the detection signal is received, where the first and the second wave shaping circuits respectively output the first and the second signals.

19. The time-to-digital conversion stage of claim 5, comprising:

a first and a second wave shaping circuits each configured to output a signal of a predetermined logical value when an input signal makes a predetermined logic transition, and to stop outputting the signal of the predetermined logical value when the detection signal is received, where the first and the second wave shaping circuits respectively output the first and the second signals.

20. The time-to-digital conversion stage of claim 1, wherein
the storage circuit includes
a plurality of register circuits, and
a register selection circuit configured to select one of the plurality of register circuits as a storage unit of the digital signal, in synchronism with the detection signal.

21. The time-to-digital conversion stage of claim 5, wherein
the storage circuit includes
a plurality of register circuits, and
a register selection circuit configured to select one of the plurality of register circuits as a storage unit of the digital signal, in synchronism with the detection signal.

22. A pipeline time-to-digital converter, comprising:
multiple ones of the time-to-digital conversion stage of claim 1, coupled in a multi-stage manner; and
an adder circuit configured to shift, with respect to one another, digits of digital values output from the respective multiple ones of the time-to-digital conversion stage of claim 1, and to add up the digital values shifted.

23. A pipeline time-to-digital converter, comprising:
multiple ones of the time-to-digital conversion stage of claim 5, coupled in a multi-stage manner; and
an adder circuit configured to shift, with respect to one another, digits of digital values output from the respective multiple ones of the time-to-digital conversion stage of claim 5, and to add up the digital values shifted.

24. A pipeline time-to-digital converter, comprising:
multiple ones of the time-to-digital conversion stage of claim 20, coupled in a multi-stage manner;
a signal selection circuit configured to selectively output one of output signals of the plurality of register circuits in each of the multiple ones of the time-to-digital conversion stage, in synchronism with the detection signal output from a last stage of the multiple ones of the time-to-digital conversion stage of claim 20; and
an adder circuit configured to shift, with respect to one another, digits of digital values output from the signal selection circuit, and to add up the digital values shifted.

25. A pipeline time-to-digital converter, comprising:
multiple ones of the time-to-digital conversion stage of claim 21, coupled in a multi-stage manner;
a signal selection circuit configured to selectively output one of output signals of the plurality of register circuits in each of the multiple ones of the time-to-digital conversion stage, in synchronism with the detection signal output from a last stage of the multiple ones of the time-to-digital conversion stage of claim 21; and
an adder circuit configured to shift, with respect to one another, digits of digital values output from the signal selection circuit, and to add up the digital values shifted.

26. A cyclic time-to-digital converter, comprising:
the time-to-digital conversion stage of claim 1;
a feedback path configured to feed back the another two resultant signals, output from the delay adjustment circuit in the time-to-digital conversion stage of claim 1, into the time-to-digital conversion stage of claim 1; and
an adder circuit configured to latch digital values, output from the time-to-digital conversion stage of claim 1, in synchronism with the detection signal output from the time-to-digital conversion stage of claim 1, to shift digits of the digital values latched with respect to one another, and to add up the digital values shifted.

27. A cyclic time-to-digital converter, comprising:
the time-to-digital conversion stage of claim 5;
a feedback path configured to feed back the another two resultant signals, output from the delay adjustment circuit in the time-to-digital conversion stage of claim 5, into the time-to-digital conversion stage of claim 5; and
an adder circuit configured to latch digital values, output from the time-to-digital conversion stage of claim 5, in synchronism with the detection signal output from the time-to-digital conversion stage of claim 5, to shift digits of the digital values latched with respect to one another, and to add up the digital values shifted.

28. A cyclic time-to-digital converter, comprising:
the time-to-digital conversion stage of claim 20;
a feedback path configured to feed back the another two resultant signals, output from the delay adjustment circuit in the time-to-digital conversion stage of claim 20, into the time-to-digital conversion stage of claim 20; and
an adder circuit configured to shift, with respect to one another, digits of digital values output from the respective plurality of register circuits in the time-to-digital conversion stage of claim 20, and to add up the digital values shifted.

29. A cyclic time-to-digital converter, comprising:
the time-to-digital conversion stage of claim 21;
a feedback path configured to feed back the another two resultant signals, output from the delay adjustment circuit in the time-to-digital conversion stage of claim 21, into the time-to-digital conversion stage of claim 21; and
an adder circuit configured to shift, with respect to one another, digits of digital values output from the respective plurality of register circuits in the time-to-digital conversion stage of claim 21, and to add up the digital values shifted.

* * * * *